United States Patent
Chang et al.

(10) Patent No.: US 9,425,044 B2
(45) Date of Patent: Aug. 23, 2016

(54) COMPOSITE SPACER FOR SILICON NANOCRYSTAL MEMORY STORAGE

(71) Applicant: Taiwan Semiconductor Manufacturing Co., Ltd., Hsin-Chu (TW)

(72) Inventors: Yu-Hsing Chang, Taipei (TW); Ming Chyi Liu, Hsinchu (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/461,565

(22) Filed: Aug. 18, 2014

(65) Prior Publication Data

US 2016/0049420 A1 Feb. 18, 2016

(51) Int. Cl.

| | |
|---|---|
| H01L 29/788 | (2006.01) |
| H01L 21/02 | (2006.01) |
| H01L 29/66 | (2006.01) |
| H01L 21/3213 | (2006.01) |
| H01L 21/28 | (2006.01) |
| H01L 29/423 | (2006.01) |
| H01L 27/115 | (2006.01) |

(52) U.S. Cl.
CPC .... *H01L 21/02601* (2013.01); *H01L 21/02532* (2013.01); *H01L 21/28273* (2013.01); *H01L 21/3213* (2013.01); *H01L 27/11521* (2013.01); *H01L 29/42328* (2013.01); *H01L 29/6656* (2013.01); *H01L 29/66825* (2013.01); *H01L 29/7881* (2013.01)

(58) Field of Classification Search
CPC .............. H01L 27/11517; H01L 27/11568; H01L 27/11575; H01L 27/1157; H01L 27/11563
See application file for complete search history.

(56) References Cited

U.S. PATENT DOCUMENTS

| | | | | | |
|---|---|---|---|---|---|
| 6,642,103 | B2* | 11/2003 | Wils | ...................... | H01L 27/115 257/E21.422 |
| 8,895,397 | B1* | 11/2014 | Shum | ................ | H01L 27/11563 438/279 |
| 8,945,997 | B2* | 2/2015 | Zhang et al. | ................... | 438/128 |
| 2015/0179821 | A1* | 6/2015 | Min | ...................... | H01L 29/792 29/792 |
| 2015/0187787 | A1* | 7/2015 | Shum | ................ | H01L 27/11568 257/365 |

OTHER PUBLICATIONS

Tiwari, et al. "A Silicon Nanocrystals Based Memory." American Institute of Physics, Appl. Phys. Lett. 68 (10), Mar. 4, 1996.

* cited by examiner

*Primary Examiner* — Jesse Y Miyoshi
*Assistant Examiner* — Tuan A Hoang
(74) *Attorney, Agent, or Firm* — Eschweiler & Associates, LLC

(57) ABSTRACT

Some embodiments relate to a memory device comprising a charge-trapping layer disposed between a control gate and a select gate. A capping structure is disposed over an upper surface of the control gate, and a composite spacer is disposed on a source-facing sidewall surface of the control gate. The capping structure and the composite spacer prevent damage to the control gate during one more etch processes used for contact formation to the memory device. To further limit or prevent the select gate sidewall etching, some embodiments provide for an additional liner oxide layer disposed along the drain-facing sidewall surface of the select gate. The liner oxide layer is configured as an etch stop layer to prevent etching of the select gate during the one or more etch processes. As a result, the one or more etch processes leave the control gate and select gate substantially intact.

19 Claims, 24 Drawing Sheets

US 9,425,044 B2

COMPOSITE SPACER FOR SILICON NANOCRYSTAL MEMORY STORAGE

BACKGROUND

Flash memory is used in a wide variety of electronic applications. Some flash memory cells utilize a floating gate field-effect transistor (FET), which stores one or more bits of data in the form of a variable level of electric charge within a "floating" gate. The floating gate is arranged above a channel of, and below a control gate of, the FET, but is electrically-isolated from both by an oxide layer. The memory cell stores the electric charge when the FET is in an "on" state (i.e., when current flows between the source and drain) by applying a voltage to the control gate, which causes electrons to tunnel from the channel into the floating gate. Because the floating gate is electrically-isolated from the channel and the control gate, electrons that tunnel into it will remain there indefinitely.

Electric charge trapped within the floating gate screens the electric field from the control gate within the channel, which increases the threshold voltage ($V_t$) of the FET. For flash memory devices that use an array of memory cells, the stored data can be read out of the array by measuring which cells experience $V_t$ increase (e.g., store a "1") and which don't (e.g., store a "0").

Other flash memory cells utilize a charge-trapping memory layer, which includes a plurality of silicon nanocrystals, rather than a floating gate. Some flash memory cells with silicon nanocrystals tend to limit leakage, and hence improve memory data retention. This is because while a floating gate is a continuous layer, at least some of the silicon nanocrystals are spaced apart from one-another within the charge trapping layer. For example, the nanocrystals may tend to form "clumps" with small gaps between adjacent clumps. As a result, a leakage path from a single silicon nanocrystal, or single clump, results in only the loss of charge stored within that silicon nanocrystal, not the entire memory element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
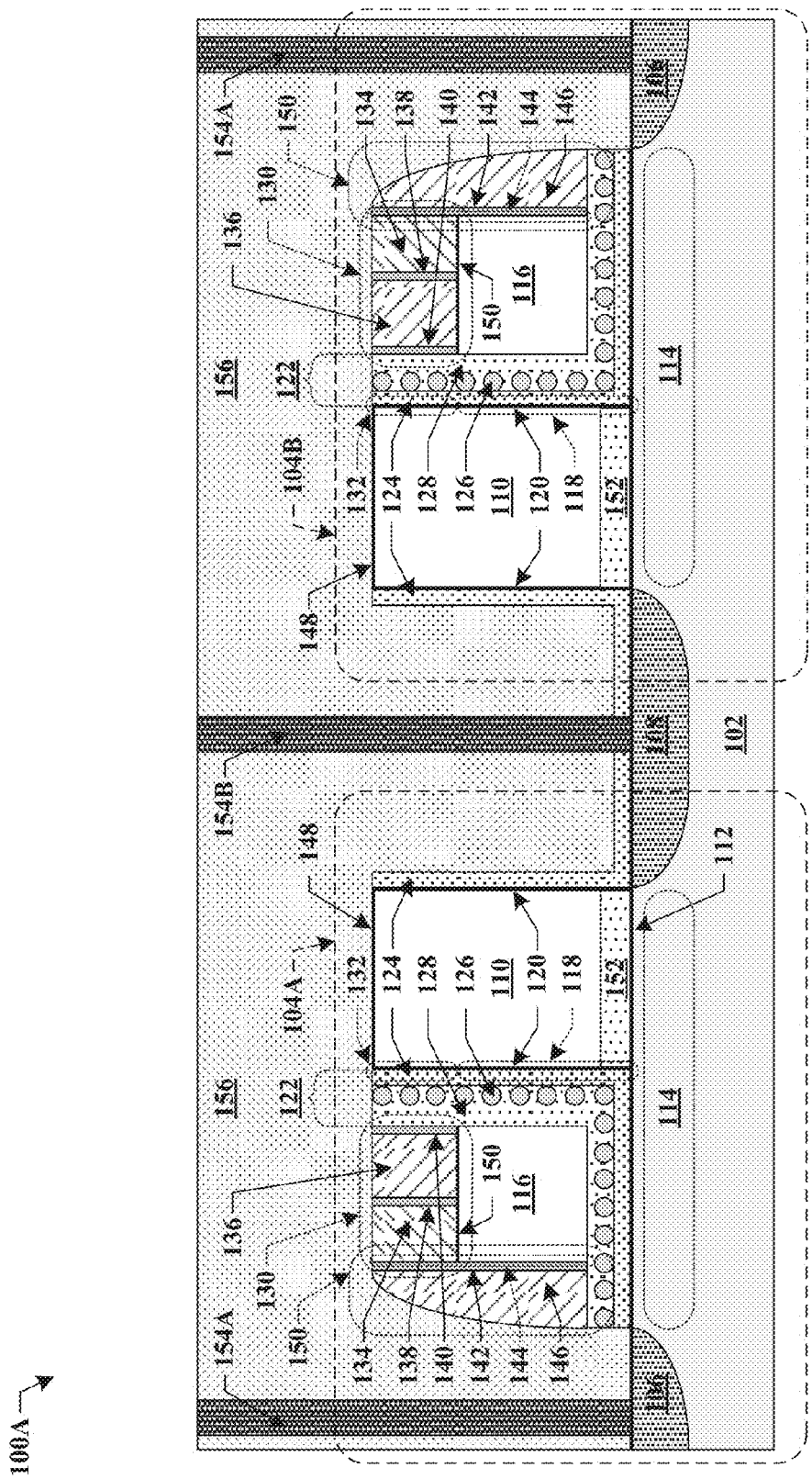
FIGS. 1A-1B illustrates some embodiments of a memory devices formed in accordance with the present disclosure.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some flash memory cells utilize a select gate and a memory gate arranged between source/drain regions of a given flash memory cell. A charge-trapping memory layer is arranged between neighboring sidewalls of the select gate and memory gate. The charge trapping memory layer includes first and second oxide layers that line the sidewalls of the control gate and select gate, respectively, and a plurality of silicon nanocrystals arranged between the first and second oxide layers. The silicon nanocrystals have an advantage over some conventional memory storage elements, such as a floating gate, because they minimize leakage, and hence improve memory data retention.

To form such a memory device, the charge-trapping layer is formed over a top surface and sidewall surfaces of the select gate. An actual control gate—which may be referred to as "memory gate" in some contexts—is then formed adjacent to the charge-trapping layer one side of the select gate, and a sacrificial control gate is formed adjacent to the charge-trapping layer on the other side of the select gate. A drain is arranged under the sacrificial control gate. To form a contact to this drain, one more etch processes are used to remove the sacrificial control gate. The one more etch processes may remove portions, or otherwise cause damage to, an upper surface and sidewall surfaces of the control gate, because these surfaces are exposed during the one more etch processes.

The one more etch processes may further remove portions of the charge-trapping layer between the select gate and the sacrificial control gate, but should ideally leave the oxide layer nearest the select gate intact. Unfortunately, however, because the silicon nanocrystals have random spacings in the charge trapping layer, the etch rate has local variations throughout the charge trapping layer depending on the localized concentration of silicon nanocrystals. As a result, the etch rate of the charge-trapping layer is not well-controlled, and in some instances, the charge trapping layer is completely etched away from the drain-facing sidewall of the select gate, which exposes the select gate to damage during the one more etch processes.

To limit or prevent the etching of the control gate, a seal layer is formed over the upper surface and the sidewall surfaces of the control gate prior to the one more etch processes. The seal layer forms a capping structure over the control gate, and a composite spacer on a source-facing sidewall surface of the control gate. The capping structure and the composite spacer stop or impede any excess etching to prevent damage to the control gate during the one more etch processes. Moreover, to limit or prevent the select gate sidewall etching, some embodiments of the present disclosure provide an additional etch stop layer disposed along the drain-facing sidewall surface of the select gate, between the sidewall surface of the select gate and an adjacent charge trapping layer. This additional etch stop layer is arranged such that if the charge trapping layer is locally etched away due to random etch variations, for example, the additional etch stop layer will stop or impede any excess etching to prevent damage to the select gate. As a result, the control gate and select gate are left substantially intact after the one or more etch processes.

FIG. 1A illustrates some embodiments of a memory device 100A, formed on a semiconductor substrate 102, comprising a pair of the memory cells 104A, 104B having individual source regions 106 and a shared drain region 108. Each memory cell 104A, 104B includes a select gate 110 formed over a surface 112 of the semiconductor substrate 102, and separated from the semiconductor substrate by a gate dielectric 152. The select gate 110 is formed between the individual source regions 106 and the shared drain region 108, which are laterally separated by a channel region 114 formed beneath the select gate 110. A control gate 116 is disposed along a lower portion 118 of a sidewall surface 120 of the select gate 110, and over the channel region 114 between the select gate 110 and the source region 106. A charge-trapping layer 122 separates the control gate 116 from the select gate 110, and is configured to store electric charge in response to independent biasing of the select and the control gates 110, 116.

The charge-trapping layer 122 comprises a tunneling oxide layer 124 formed along the sidewall surface 120 of the select gate 110, and over the surface 112 of a semiconductor substrate 102 between the select gate 110 and the source regions 106. A plurality of substantially spherically-shaped silicon nanocrystals 126 are formed on a surface of the tunneling oxide layer 124, and are configured to store different amounts of electric charge (i.e., electrons) depending upon independent biases applied to the select and the control gates 110, 116. A control oxide layer 128 is formed along the surface of the tunneling oxide layer 124. The plurality of silicon nanocrystals 126 abut the surface of the tunneling oxide layer 124. The tunneling oxide layer 124 and the control oxide layer 128 in combination completely embed and surround the plurality of silicon nanocrystals 126, and isolate them from both the select gate 110 and the control gate 116.

A capping structure 130 is formed over the control gate 116 and along an upper portion 132 of the sidewall surface 120 of the select gate 110. For the embodiments of FIG. 1A, the capping structure 130 comprises a first nitride structure 134, and second nitride structure 136, which are laterally separated from one-another by a first vertically-oriented liner oxide layer 138. The capping structure 130 prevents etching of an upper surface of the control gate 116 during the one or more etch processes used for contact formation to the shared drain region 108. For the embodiments of FIG. 1A, a second vertically-oriented liner oxide layer 140 is disposed along the upper portion 132 of the sidewall surface 120 of the select gate 110, which separates the select gate 110 from the second nitride structure 136.

A composite spacer 150 is also formed on source side of the control gate 116, and protects the source side of the control gate 116 from damage during contact formation to the shared drain region 108. The composite spacer 150 is also formed from the single liner oxide layer, and comprises a third vertically-oriented liner oxide layer 142 and a third nitride structure 146. For the embodiments of FIG. 1A, the third vertically-oriented liner oxide layer 142 is disposed along a combined sidewall surface 144 of the control gate 116 and the first nitride structure 134, and separates the control gate 116 and the first nitride structure 134 from the third nitride structure 146.

In some embodiments, the first, second, and third vertically-oriented liner oxide layers 138, 140, 142 comprise silicon dioxide (e.g., $SiO_2$) with a thickness in a range of about 1 nm to about 5 nm, measured in a horizontal direction. In some embodiments, the first, second, and third nitride structures 134, 136, 146 comprise silicon nitride (SiN).

Source contacts 154A (e.g., tungsten) are formed to the individual source regions 106, and a drain contact 154B is formed to the shared drain region 108, within an inter-layer dielectric (ILD) 156 disposed over the memory device 100A. The capping structure 130 and composite spacer 150 result from a manufacturing method used to form the memory device 100A. As will be further demonstrated in FIGS. 3A-3N, formation of the drain contact 154B to the shared drain region 108 utilizes one or more etch processes to remove control gate material and portions of the charge-trapping layer 122 overlying the drain region 108. The first, second, and third vertically-oriented liner oxide layers 138, 140, 142 comprise remnants of a single liner oxide layer formed along the charge-trapping layer 122, along a top surface 148 and sidewall surfaces 120 of the select gate 110. The single liner oxide layer is configured as a sacrificial etch stop layer to prevent damage to the select gate 110 by the one or more etch processes used to form the drain contact 154B. In particular, the single liner oxide layer prevents etching of the select gate 110, which can result in failure of the memory device 100A.

Therefore, the capping structure 130, the composite spacer 150, and the single liner oxide layer enlarge the process window for the one or more etch processes used for formation of the drain contact 154B to the drain region 108.

Figure 1B:
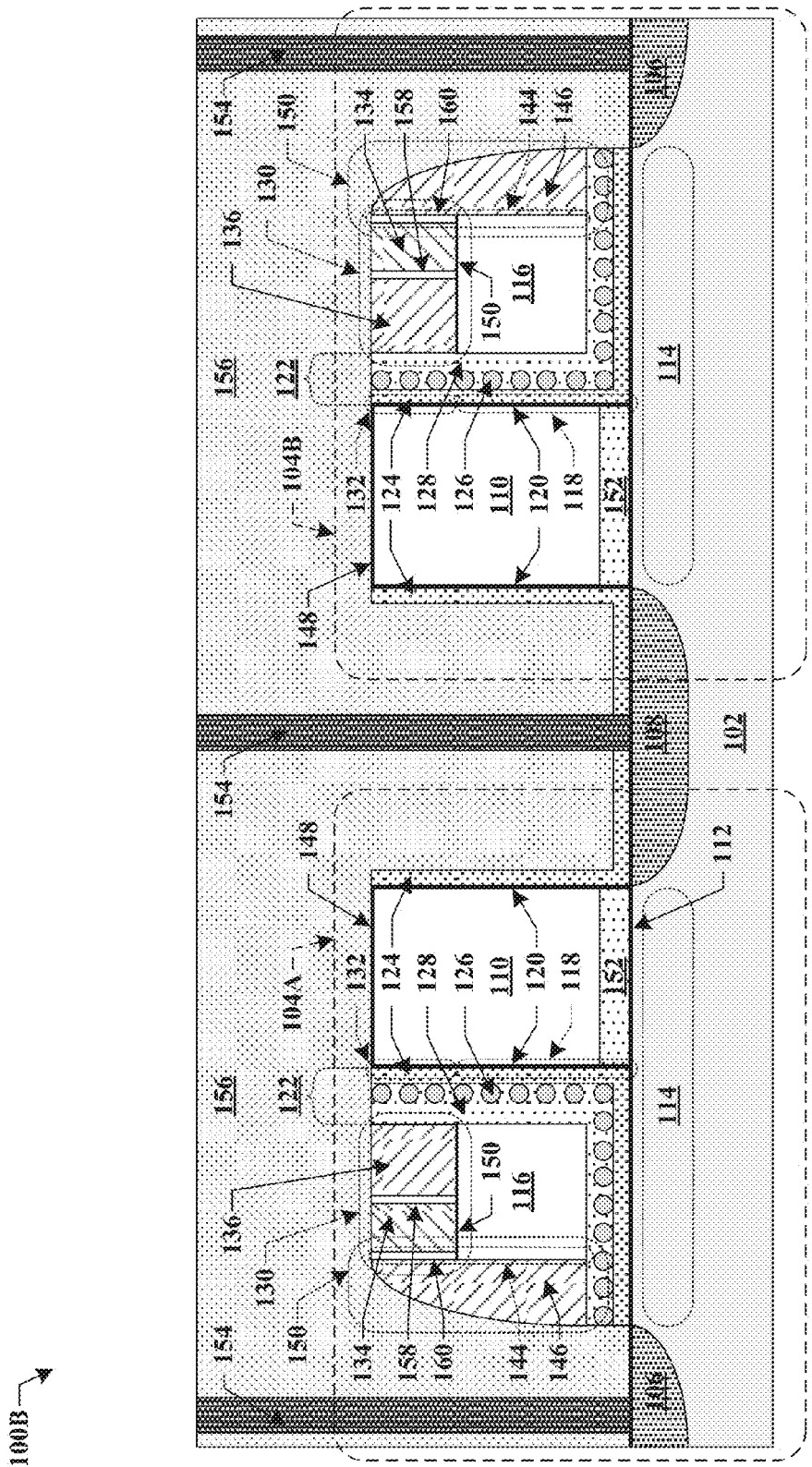

FIG. 1B illustrates some embodiments of a memory device 100B, which is substantially similar to the memory device 100A of FIG. 1A. The memory device 100B also comprises a capping structure 130 and a composite spacer 150. However, the memory device 100B does not contain a single liner oxide layer, which subsequently forms the first, second, and third vertically-oriented liner oxide layers 138, 140, 142 of memory device 100A. Instead, the memory device 100B contains a first vertically-oriented native oxide layer 158 disposed between the first and second nitride structures 134, 136. In addition, the capping a second vertically-oriented native oxide layer 160 which separates the capping structure 130 from the composite spacer 150.

In some embodiments, the first and second vertically-oriented native oxide layers 158, 160 comprise silicon oxynitride (SiON). In some embodiments, the first and second vertically-oriented native oxide layers 158, 160 have a thickness in a range of about 1 nm to about 2 nm, measured in a horizontal direction.

Figure 2:
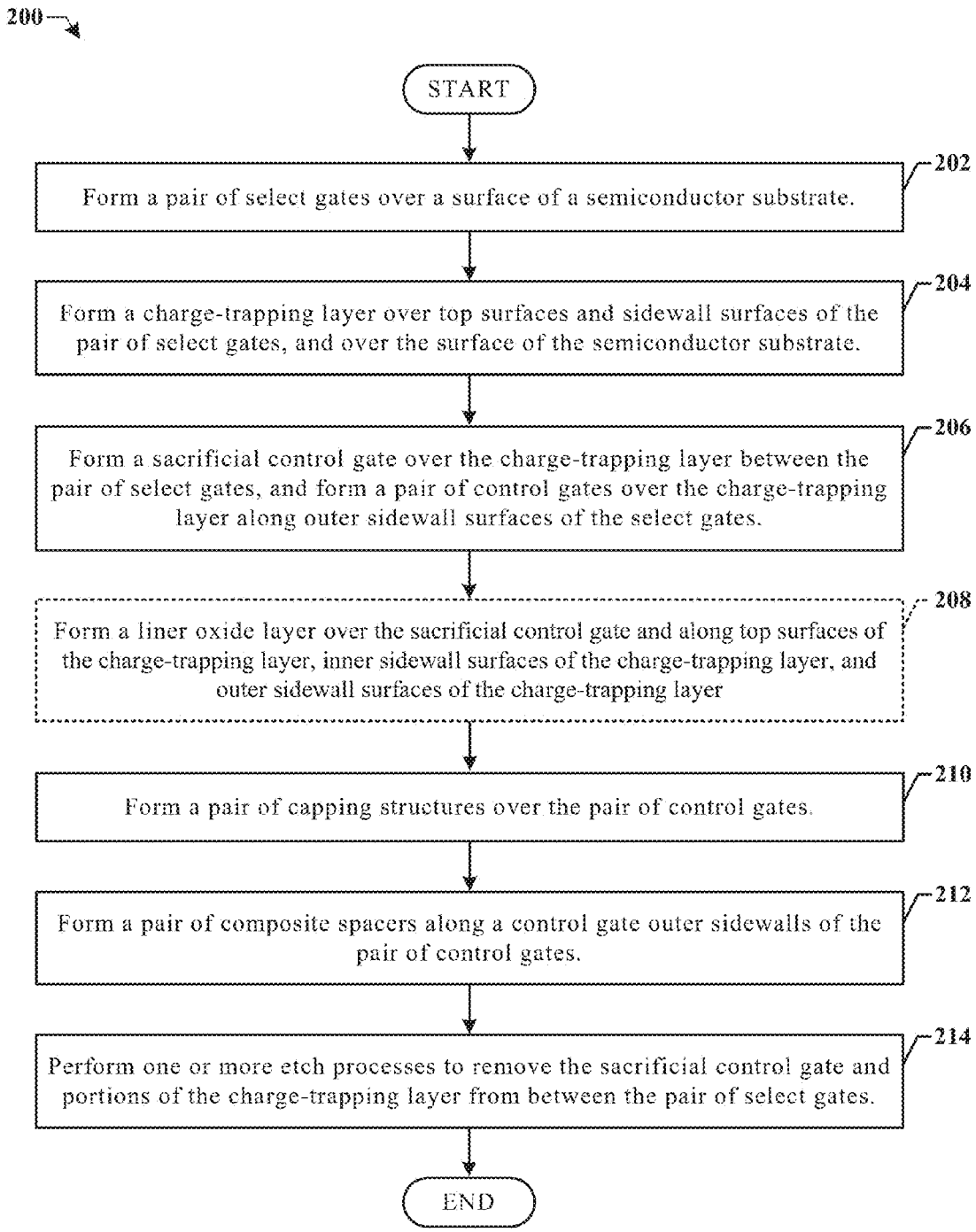
FIG. 2 illustrates come embodiments of a method to form a memory device in accordance with the present disclosure.
Figure 3A:
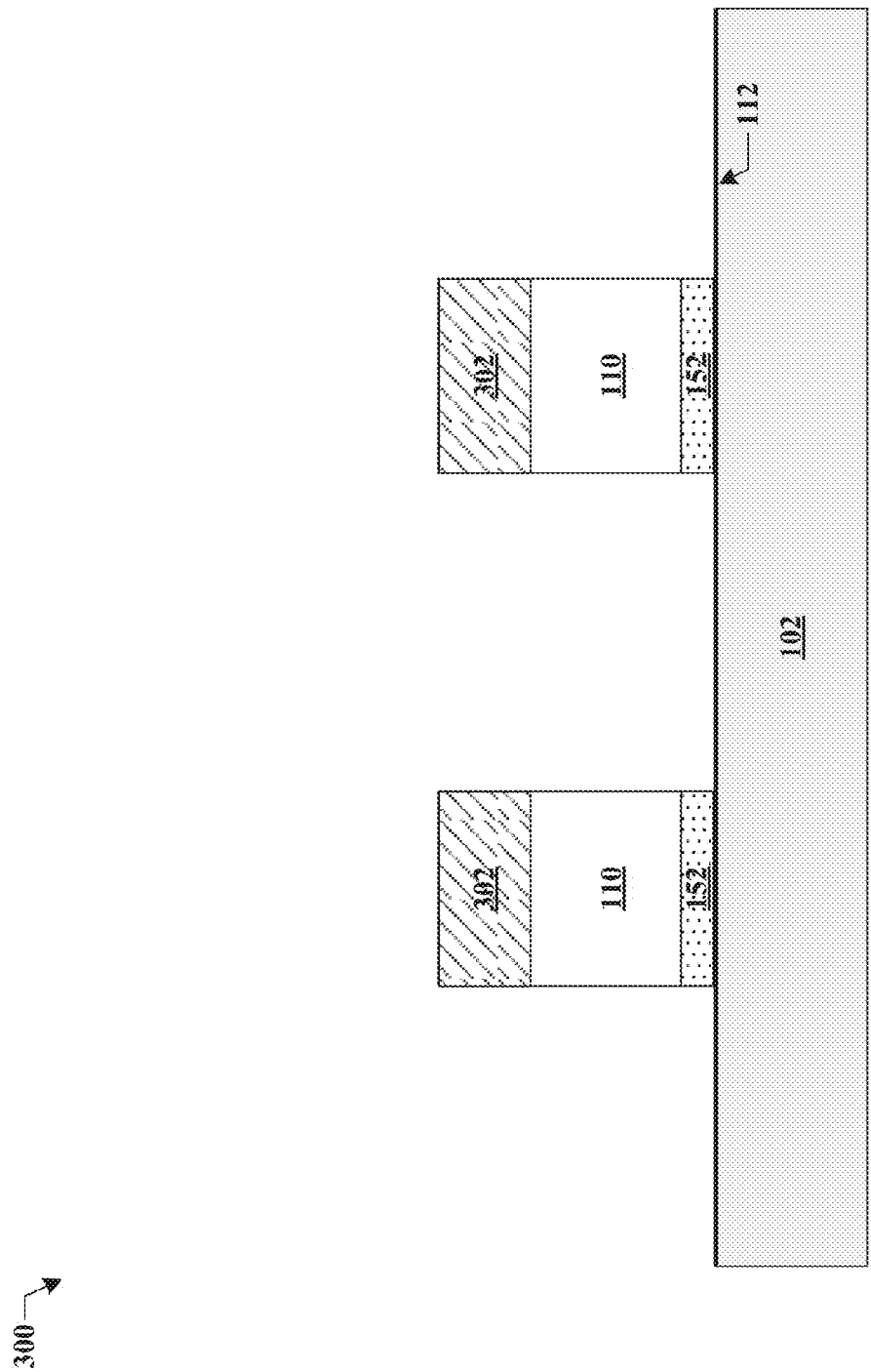
FIGS. 3A-3N illustrates a series of cross-sectional views that collectively depict formation of a memory device in accordance with the present disclosure.

FIG. 2 illustrates come embodiments of a method 200 to form the memory device 100A of FIG. 1A, or optionally, memory device 100B of FIG. 1B. Detailed cross-sectional embodiments of formation of the memory device 100A are shown in FIGS. 3A-3N. Detailed cross-sectional embodiments of formation of the memory device 100B are shown in FIGS. 4A-4G.

At 202 a pair of select gates are formed over a surface of a semiconductor substrate.

At 204 a charge-trapping layer is formed over top surfaces and sidewall surfaces of the pair of select gates, and over the surface of the semiconductor substrate.

At 206 a sacrificial control gate is formed over the charge-trapping layer between the pair of select gates.

At 208 a liner oxide layer, configured as an etch stop layer, is optionally formed over the sacrificial control gate and along top surfaces of the charge-trapping layer, inner sidewall surfaces of the charge-trapping layer, and outer sidewall surfaces of the charge-trapping layer. Formation of the liner oxide in step 210, and execution of steps 210 through 214 of the method 200, results in the formation of the memory device 100A of FIG. 1A. Alternatively, the omission of the step 210, and execution of steps 210 through 214 of the method 200, results in the formation of the memory device 100B of FIG. 1B.

At 210 a pair of capping structures are formed over the pair of control gates. In some embodiments (e.g., for the memory device 100A), a capping structure of the pair comprises first and second nitride structures (e.g., SiN), which are laterally separated from one-another by a first vertically-oriented liner oxide layer (e.g., SiO$_2$). In some embodiments (e.g., for the memory device 100B), a capping structure comprises first and second nitride structures (e.g., SiN), which are laterally separated from one-another by a first vertically-oriented native oxide layer (e.g., SiON). The first vertically-oriented native oxide layer is an artifact of the process used to manufacture the memory device 100B, wherein the first and second nitride structures are disposed in separate steps, with exposure to oxygen in between (e.g., removal from a processing chamber).

At 212 a pair of composite spacers are formed along outer sidewalls of the pair of control gates. In some embodiments (e.g., for the memory device 100A), a composite spacer comprises a third nitride structure (e.g., SiN), which is laterally separated from an adjacent capping structure by a second vertically-oriented liner oxide layer (e.g., SiO$_2$). In some embodiments (e.g., for the memory device 100B), a composite spacer comprises a third nitride structure (e.g., SiN), which is laterally separated from an adjacent capping structure by a second vertically-oriented native oxide layer (e.g., SiON).

At 214 one or more etch processes are performed to form a contact to the drain region of the memory device. The one or more etch processes remove the sacrificial control gate and portions of the charge-trapping layer from between the pair of select gates. In some embodiments, the pair of capping structures and the pair of composite spacers prevent etching of the control gates by the one or more etch processes. In some embodiments, the optionally formed liner oxide layer acts as an etch stop layer to prevent etching of the select gate by the one or more etch processes.

FIGS. 3A-3N illustrates a series of cross-sectional views that collectively depict formation of the memory device 100A. Alternatively, FIGS. 3A-3F and FIGS. 4A-4G illustrate a series of cross-sectional views that collectively depict formation of the memory device 100B.

In FIG. 3A, a memory device structure 300 comprising a pair of select gates 110 is formed over a surface 112 of a semiconductor substrate 102 (e.g., Si). A hard mask 302 (e.g., silicon nitride (SiN)) is disposed above each select gate 110. The pair of select gates 110 are electrically isolated from the semiconductor substrate 102 by gate dielectrics 152. In some embodiments, the pair of select gates 110 are formed by sequentially-disposing a gate dielectric layer (e.g., SiO$_2$) over the surface 112 of the semiconductor substrate 102, disposing a gate electrode layer (e.g., polysilicon) over the gate dielectric layer, and disposing a hard mask layer (e.g., SiN) over the gate electrode layer. The sequentially-disposed layers are then patterned and etched through a lithography process to form the pair of select gates 110.

Figure 3B:
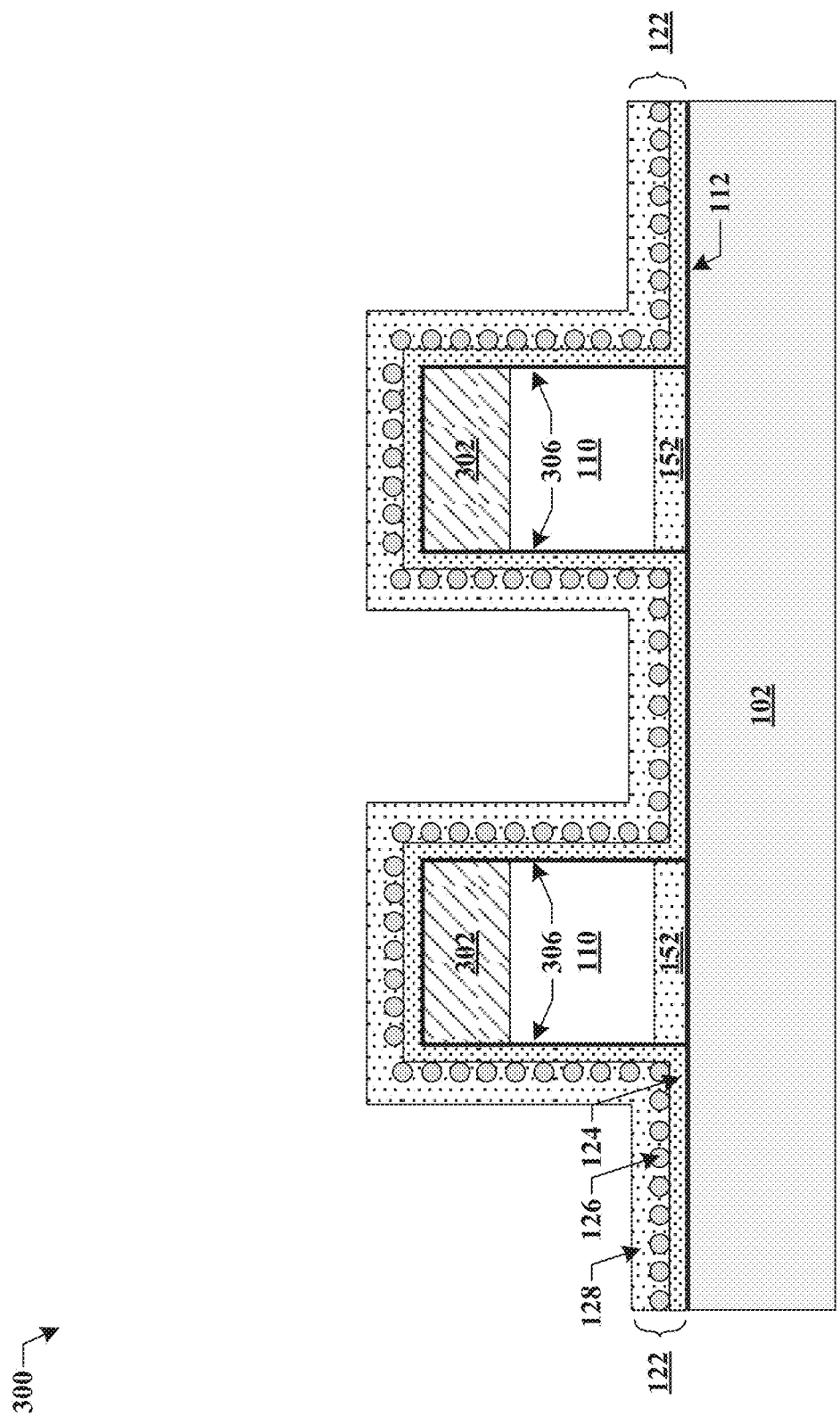

In FIG. 3B, a charge-trapping layer 122 is disposed over top surfaces 304 and sidewall surfaces 306 of the combined select gates 110 and hard masks 302, and over the surface 112 of the semiconductor substrate 102. The charge-trapping layer 122 comprises a conformal layer, and consists of a tunneling oxide layer 124 (e.g., SiO$_2$), a plurality of substantially spherically-shaped silicon nanocrystals 126 formed on a surface of the tunneling oxide layer 124, and a control oxide layer 128 (e.g., SiO$_2$) disposed along the surface of the tunneling oxide layer 124. The tunneling oxide layer 124 forms a continuous shape over the surface 112 of a semiconductor substrate 102, and along the sidewall surfaces 306 and over the top surfaces 304 of the combined select gate 110 and hard mask 302. Likewise, the control oxide layer 128 forms a continuous shape along the surface of the tunneling oxide layer 124.

Figure 3C:
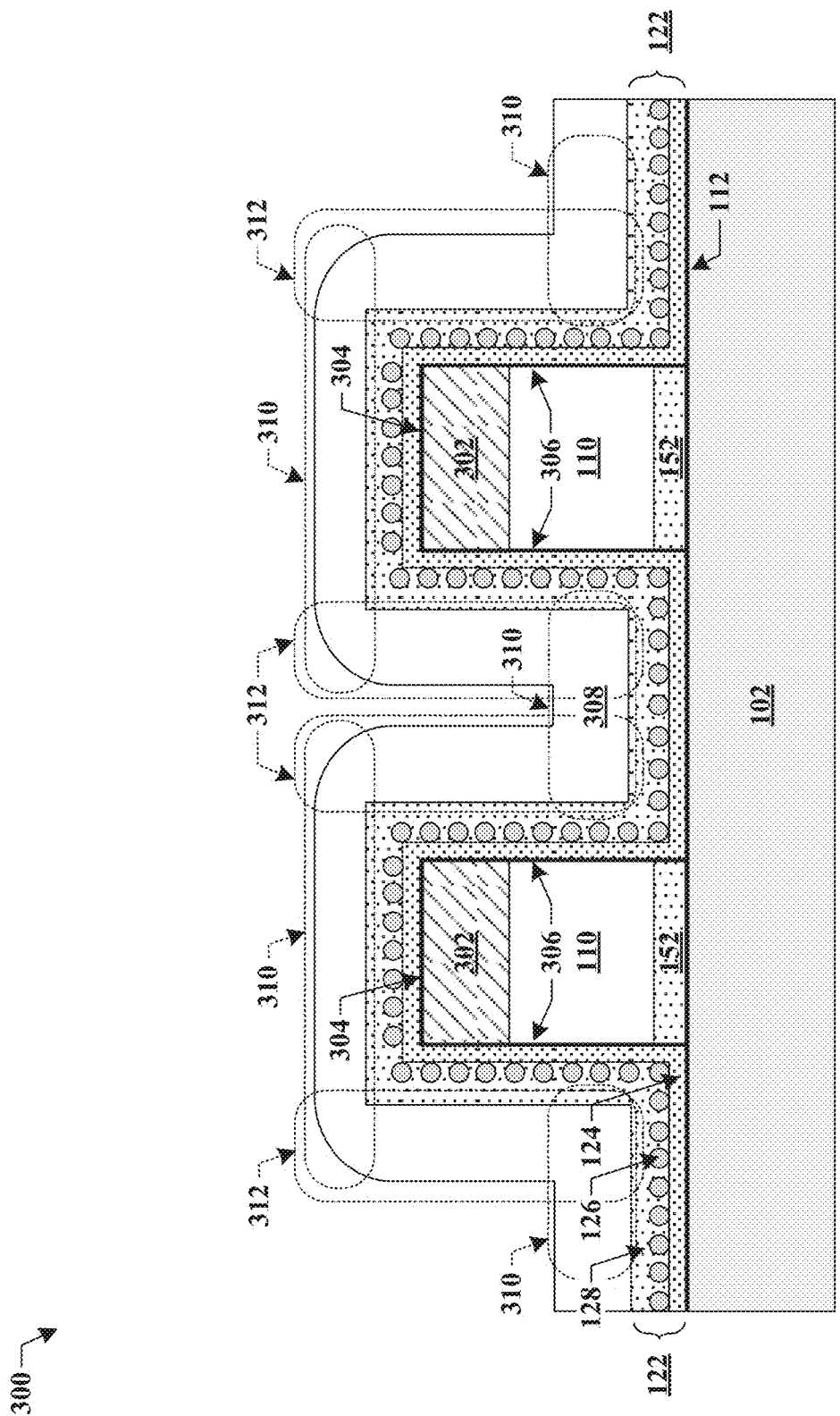

In FIG. 3C, a control gate layer 308 (e.g., polysilicon) is formed over the charge-trapping layer 122. The control gate layer 308 has horizontal control gate portions 310 formed over the top surfaces 304 of the combined select gate 110 and hard mask 302, and over the surface 112 of the semiconductor substrate 102. The control gate layer 308 also has vertical control gate portions 312 formed along the sidewall surfaces 306 of the combined select gate 110 and hard mask 302.

Figure 3D:
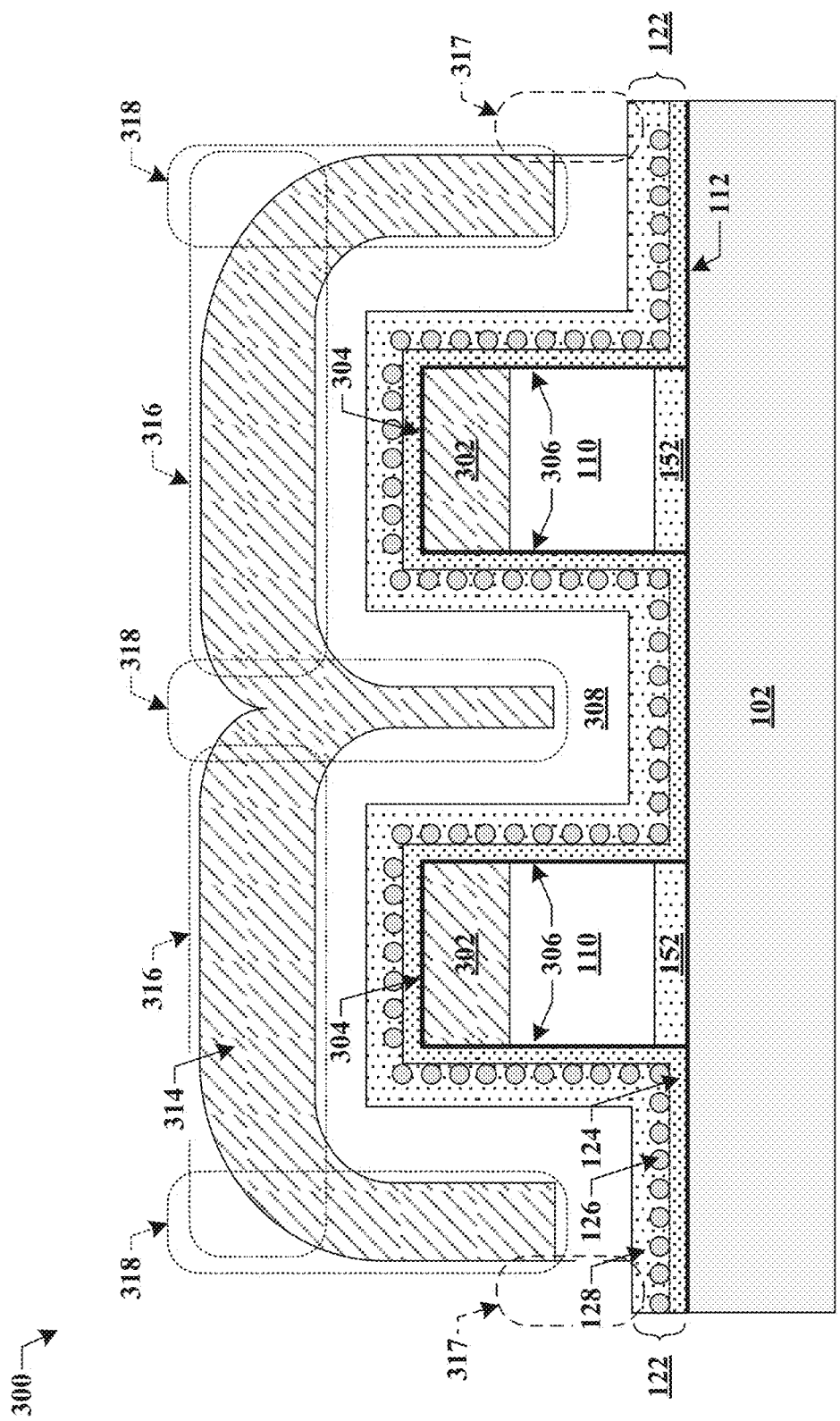

In FIG. 3D, a main spacer layer 314 (e.g., SiN) is formed over the control gate layer 308. The main spacer layer 314 has horizontal spacer layer portions 316 formed over the top surfaces 304, and vertical spacer layer portions 318 formed along the sidewall surfaces 306. A patterning step is then used to remove portions of the main spacer layer 314 and control gate layer 308 from over outer portions 317 of the surface 112 of the substrate.

Figure 3E:
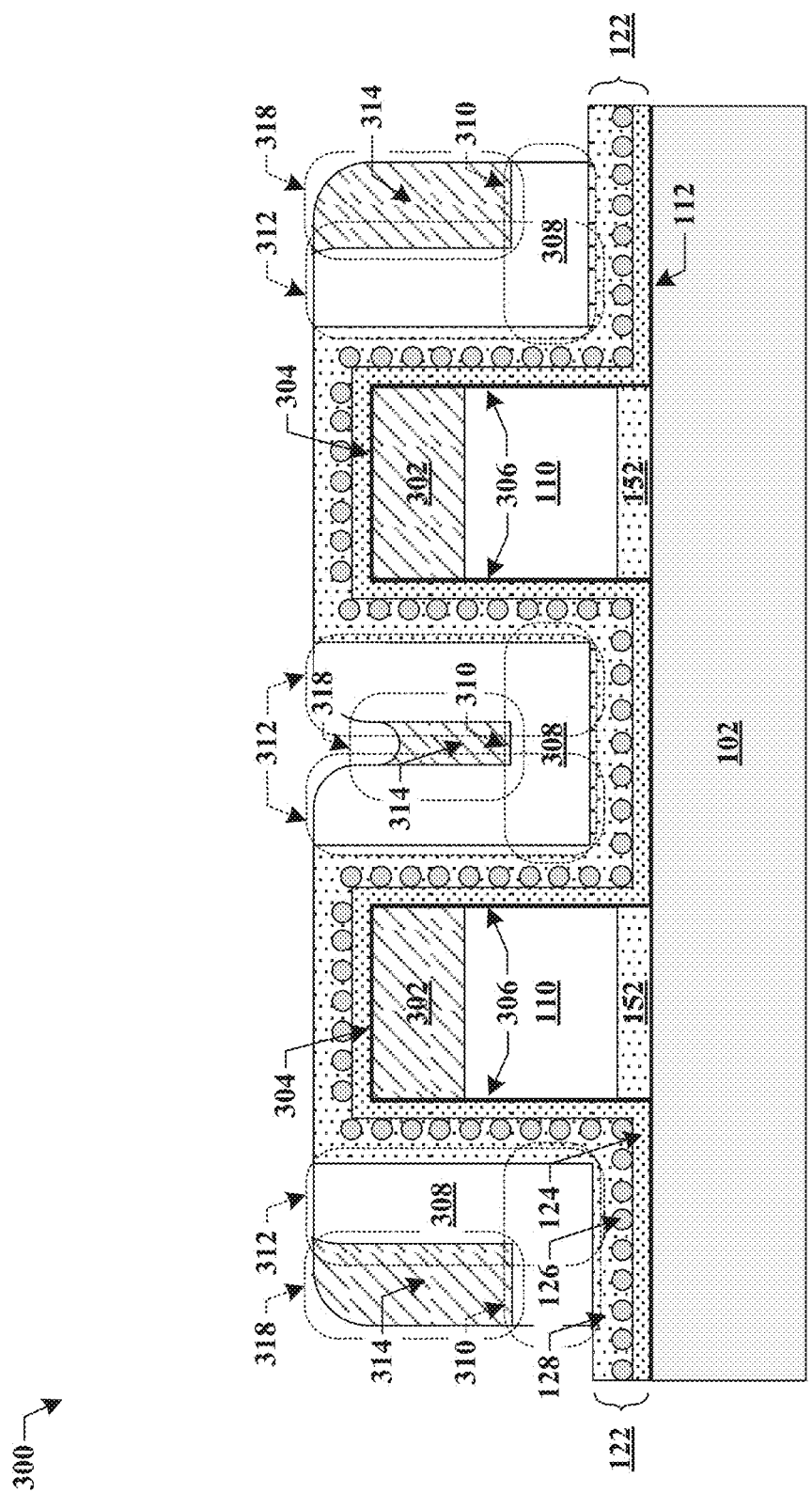

In FIG. 3E, a first etch has been performed to remove the horizontal control gate portions 310 of the control gate layer 308 and the horizontal spacer layer portions 316 of the main spacer layer 314 formed over the top surfaces 304 of the combined select gate 110 and hard mask 302, to expose the top surfaces 304. In some embodiments, the first etch comprises a wet or dry isotropic etch.

Figure 3F:
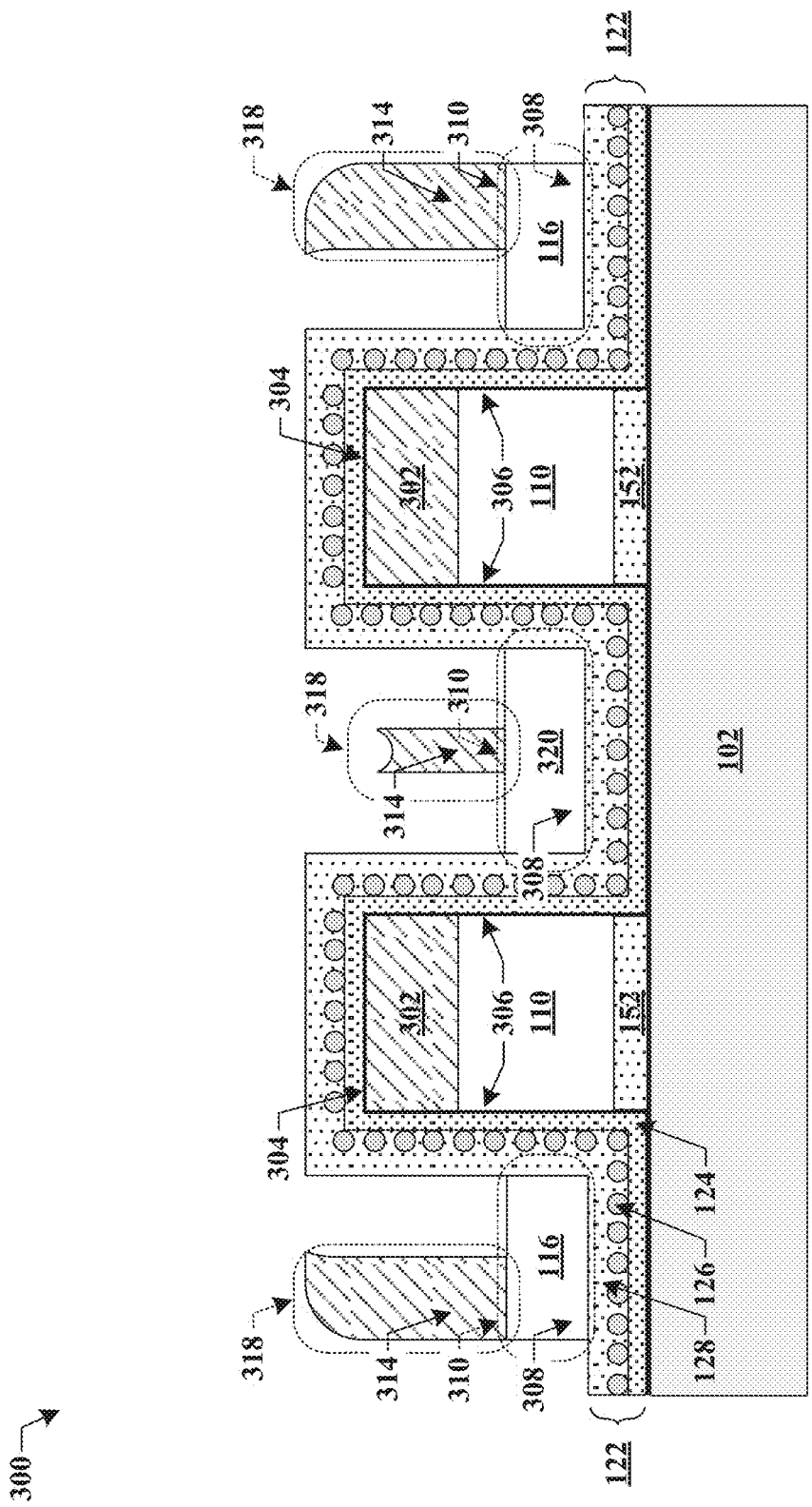

In FIG. 3F, a second etch has been performed to remove the vertical control gate portions 312 of the control gate layer 308, while leaving the horizontal control gate portions 310 formed over the surface 112 of the semiconductor substrate 102, thereby forming a pair of control gates 116 and a sacrificial control gate 320. The second etch comprises selective etch with an etch selectivity between the control gate layer 308, the main spacer layer 314 and the control oxide layer 128 (e.g., SiO$_2$), such that it etches the vertical control gate portions 312 of the control gate layer 308, while leaving the main spacer layer 314 and the control oxide layer 128 substantially intact. In some embodiments, the control gate layer 308 comprises silicon and the main spacer layer 314 comprises nitride (e.g., SiN). In such embodiments, the second etch comprises a selectivity between silicon, oxide, and nitride, such that it etches the silicon at a substantially faster rate than the oxide or nitride.

Subsequent to performing the second etch in FIG. 3F, the steps illustrated in FIGS. 3G-3N results in the formation of the memory device 100A. Alternatively, performing the steps illustrated in FIGS. 4A-4G subsequent to performing the second etch in FIG. 3F results in the formation of the memory device 100B.

Figure 3G:
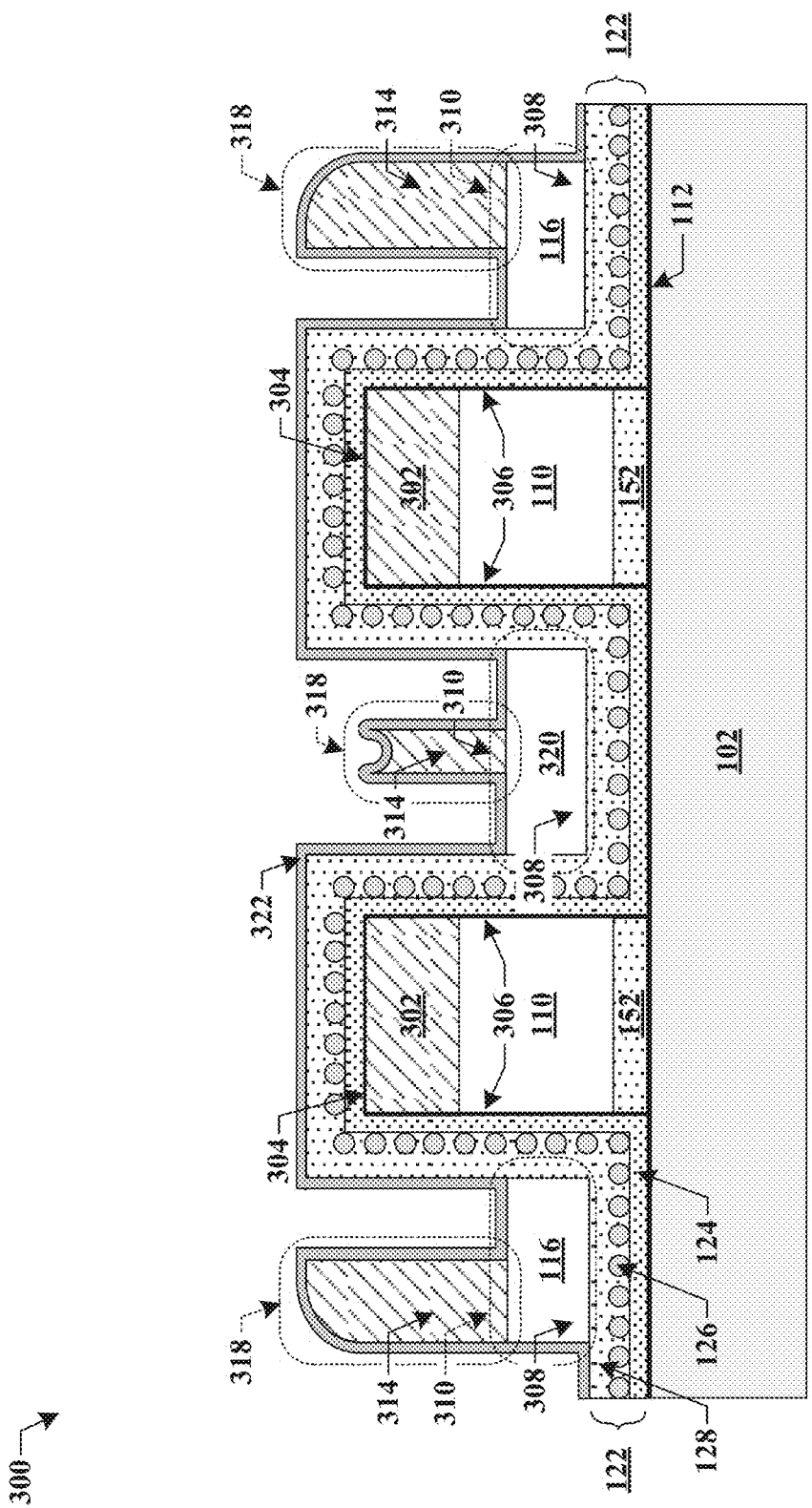

In FIG. 3G, a liner oxide layer 322 is optionally disposed along surfaces of the charge-trapping layer 122 (i.e., over the top surfaces 304 and along the sidewall surfaces 306), and over the pair of control gates 116 and the sacrificial control gate 320. The liner oxide layer 322 is configured as an etch stop layer to prevent etching of the select gates 110 by the one or more etch processes used in subsequent manufacturing steps of the memory device 100A. In some embodiments, the liner oxide layer 322 is formed by atomic layer deposition (ALD), chemical vapor deposition (CVD), or physical vapor deposition (PVD). In particular, ALD is preferred under thermal budget constraints, because it is a relatively low temperature process.

Figure 3H:
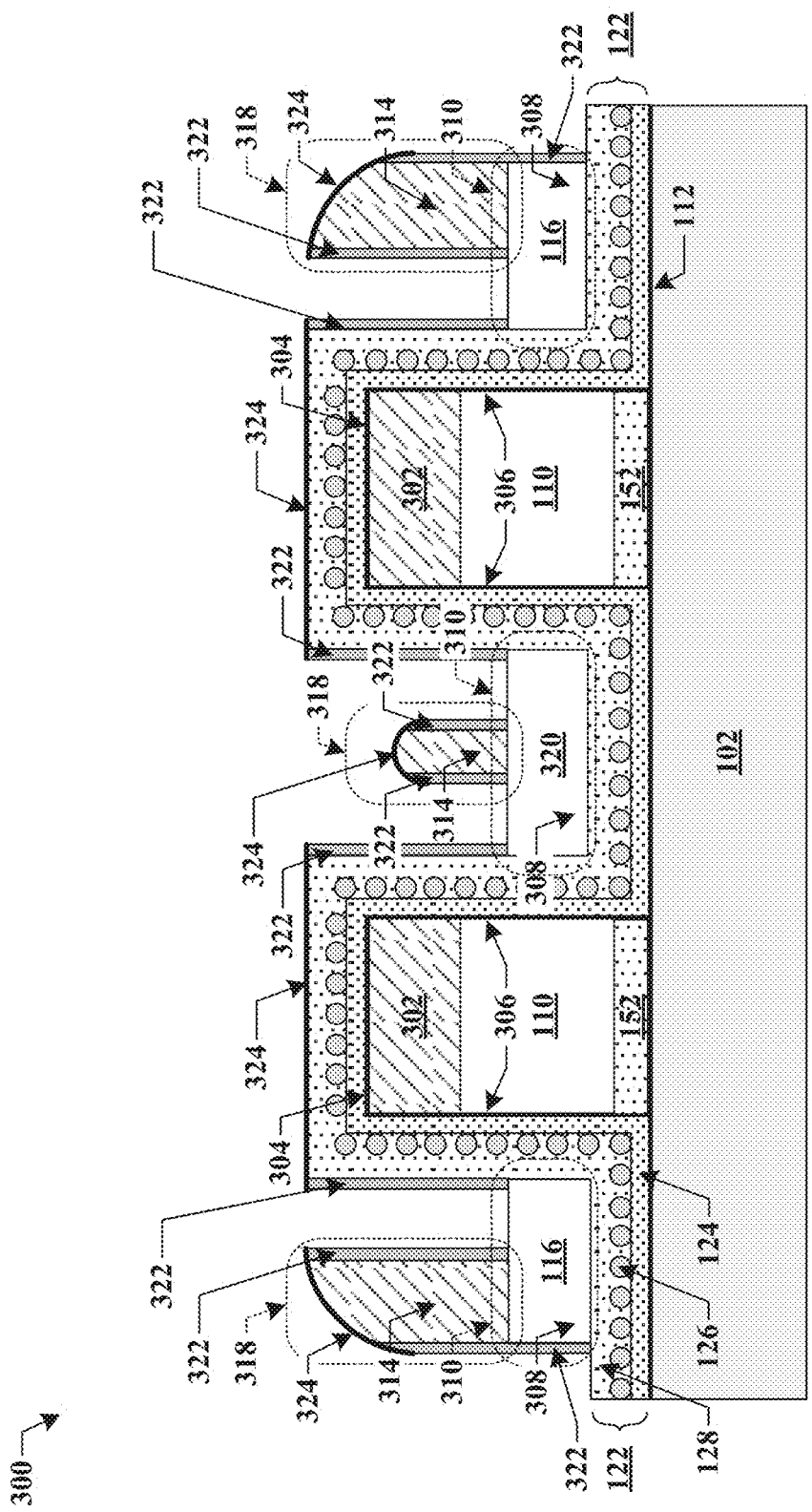

In FIG. 3H, a third etch has been performed on the liner oxide layer 322 to expose top surfaces 324 of the main spacer layer 314 and the control oxide layer 128. In some embodiments, the third etch comprises a wet or dry isotropic etch.

Figure 3I:
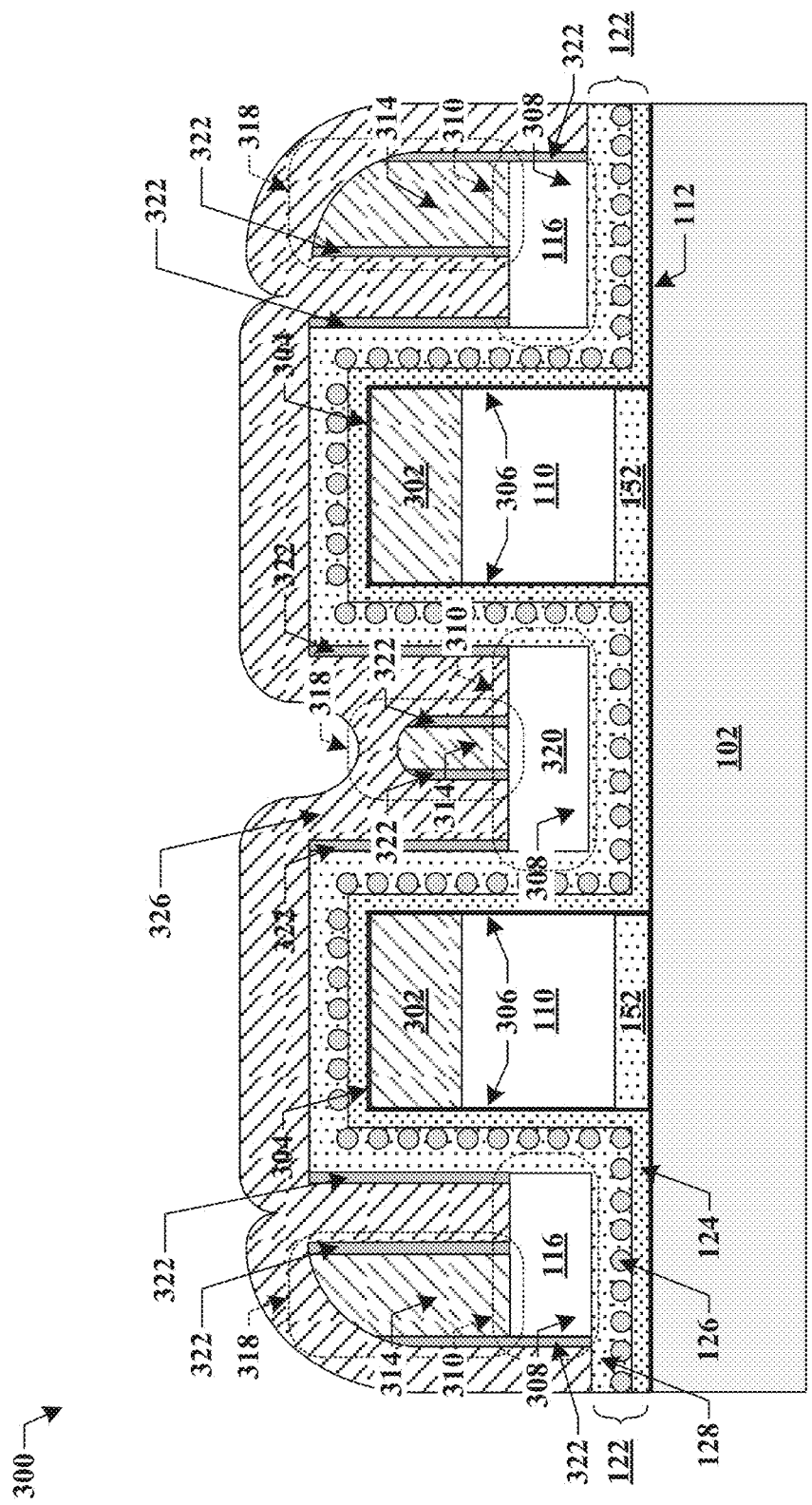

In FIG. 3I, a seal layer 326 (e.g., SiN) is disposed over portions of the charge-trapping layer 122, main spacer layer 314, liner oxide layer 322, and the pair of control gates 116 and the sacrificial control gate 320 exposed by the third etch. As will be appreciated in FIGS. 3G-3N, the seal layer 326 and liner oxide layer 322 combine to form the capping structure 130 of FIG. 1A, which protects a top portion of the pair of control gates 116 during subsequent etch steps. Likewise, as will be appreciated, the seal layer 326 and liner oxide layer 322 also combine to form the composite spacer 150 of FIG. 1A, which protects the pair of control gates 116 during etching of the charge-trapping layer 122. In some embodiments, the seal layer 326 is formed by ALD, CVD, or PVD.

Figure 3J:
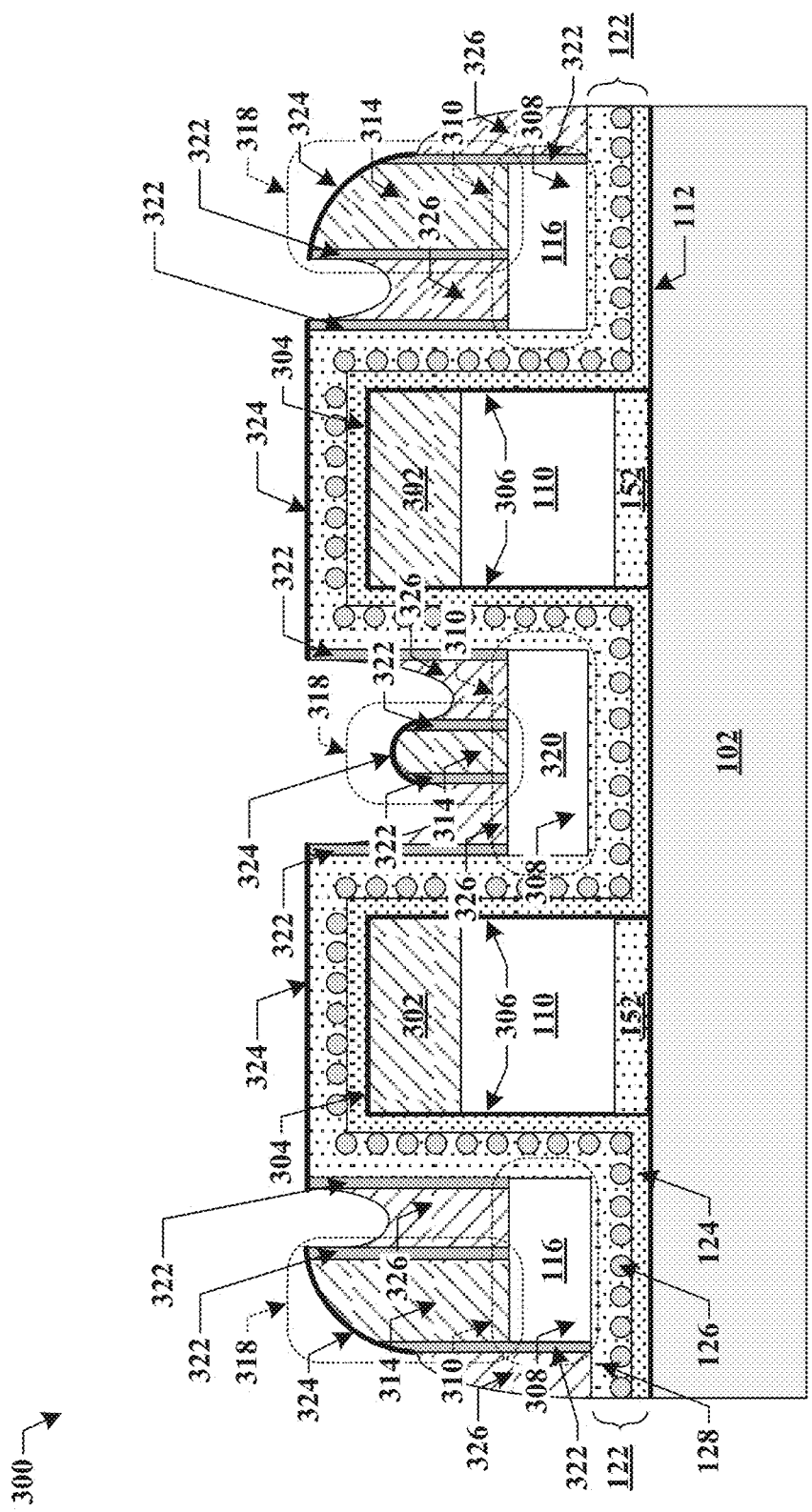

In FIG. 3J, a fourth etch has been performed on the seal layer 326 to again expose the top surfaces 324 of the main spacer layer 314 and the control oxide layer 128. In some embodiments, the fourth etch comprises a wet or dry isotropic etch. In some embodiments, the forth etch comprises a first isotropic Chemical Dry Etch (CDE), with conditions that are tuned to minimize damage to the charge-trapping layer 122 (i.e., the control oxide layer 128). The CDE conditions result in a selectivity between the oxide of the control oxide layer 128 and the nitride of the seal layer 326 of greater than about 5:1, such that the seal layer 326 is etched greater than about 5× as fast as the control oxide layer 128.

In some embodiments, the CDE conditions include a remote plasma of one or more hydrofluorocarbons (CxHyFz) and oxygen ($O_2$). In some embodiments, the CDE conditions include: a variable frequency plasma source in a frequency range of about 2 and 3 GHz, an ambient pressure in a range between about 100 and 1,000 milliTorr (mT), a hydrofluorocarbon/oxygen ratio in a range of about 0.1 and 2, a combined hydrofluorocarbon and oxygen flow, which results in a flow rate in a range of about 100 to 1,000 standard cubic centimeter per minute (sccm).

Figure 3K:
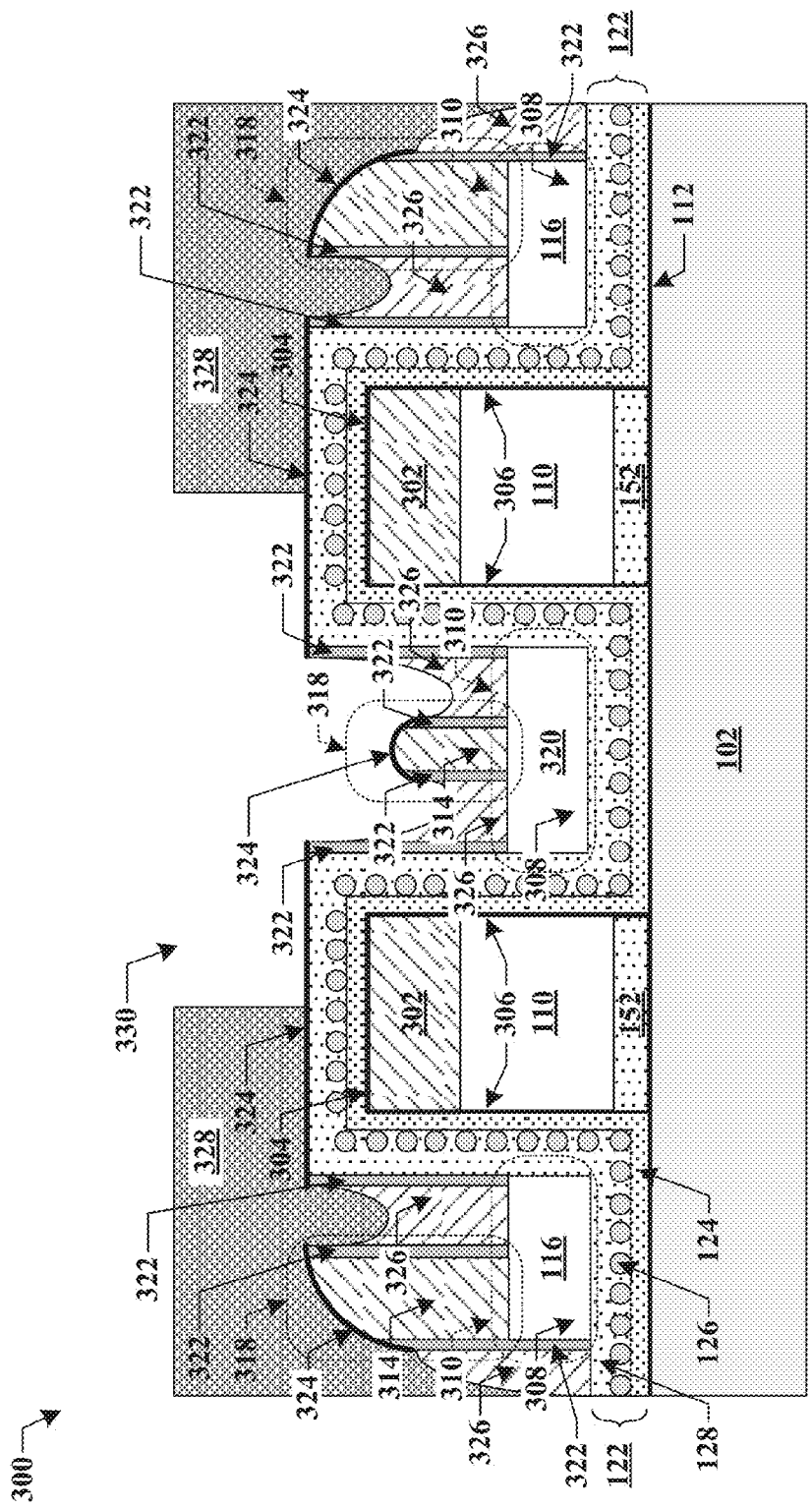

In FIG. 3K, a photoresist layer 328 is disposed, patterned, and exposed to form an opening 330 over the sacrificial control gate 320 (i.e., between the pair of select gates 110).

Figure 3L:
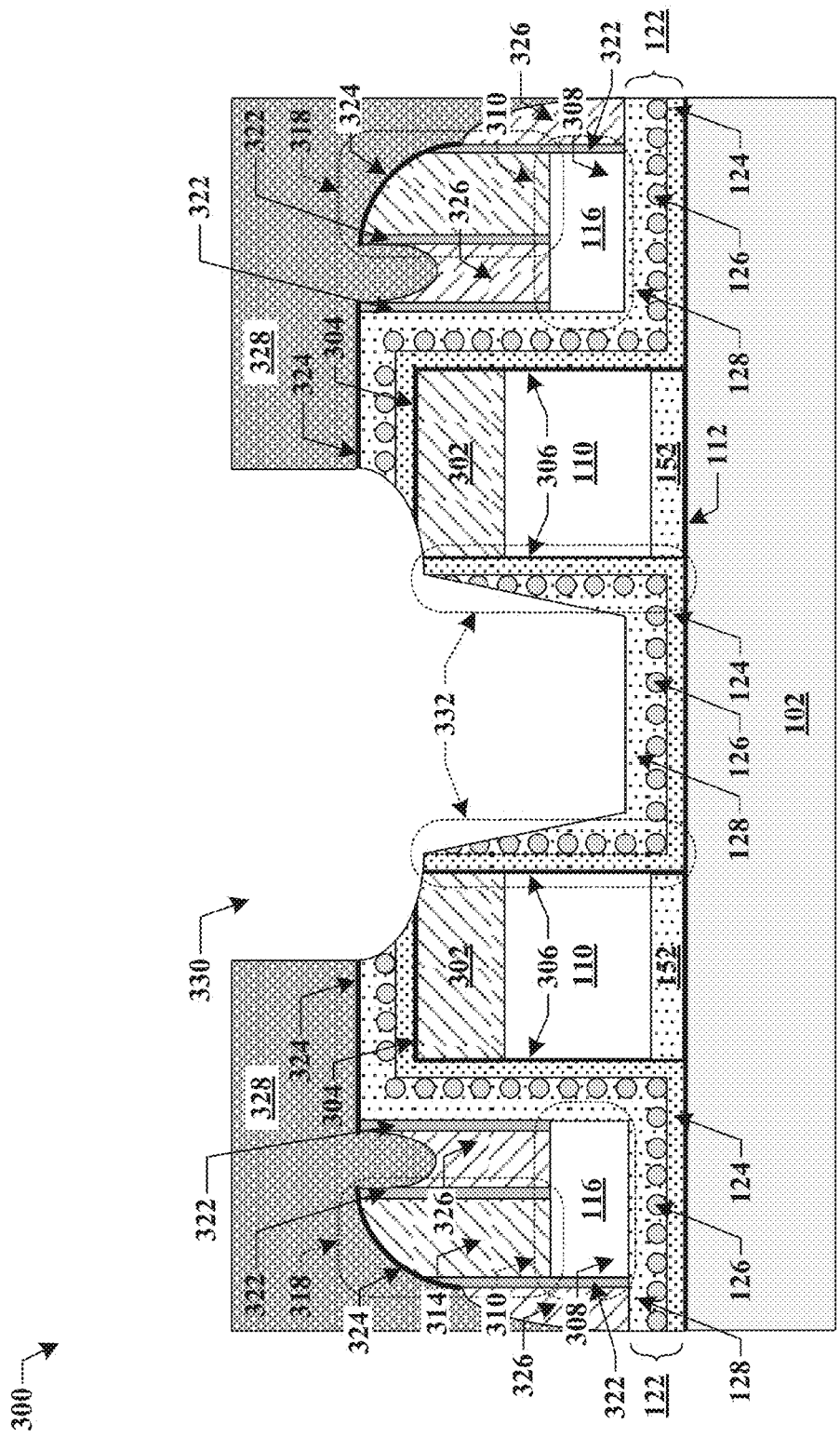

In FIG. 3L, a fifth etch has been performed through the opening 330 the photoresist layer 328, to remove the vertical spacer layer portion 318 of the spacer layer and seal layer 326 formed between the pair of select gates 110, and the sacrificial control gate 320. The fifth etch also removes a portion of the charge-trapping layer 122 (i.e., the control oxide layer 128 and silicon nanocrystals 126) from upper portions of drain-facing sidewall surfaces 332 of the select gates 110. For the embodiments of FIG. 3L, a process window for the fifth etch is enlarged by disposing the control oxide layer 128 with a substantially uniform thickness along the surface of the tunneling oxide layer 124 in FIG. 3B, which results in a substantially uniform etch rate for the control oxide layer 128. In some embodiments, the fifth etch comprises a second isotropic CDE with conditions similar to the first isotropic CDE, but with a second selectivity that is opposite the first selectivity. Consequently, the second isotropic CDE consumes the liner oxide layer 322 formed on the drain-facing sidewall surfaces 332 of the select gates 110, and formed over the surface 112 of the semiconductor substrate 102 between the select gates 110, while leaving the hard mask structures substantially intact.

Figure 3M:
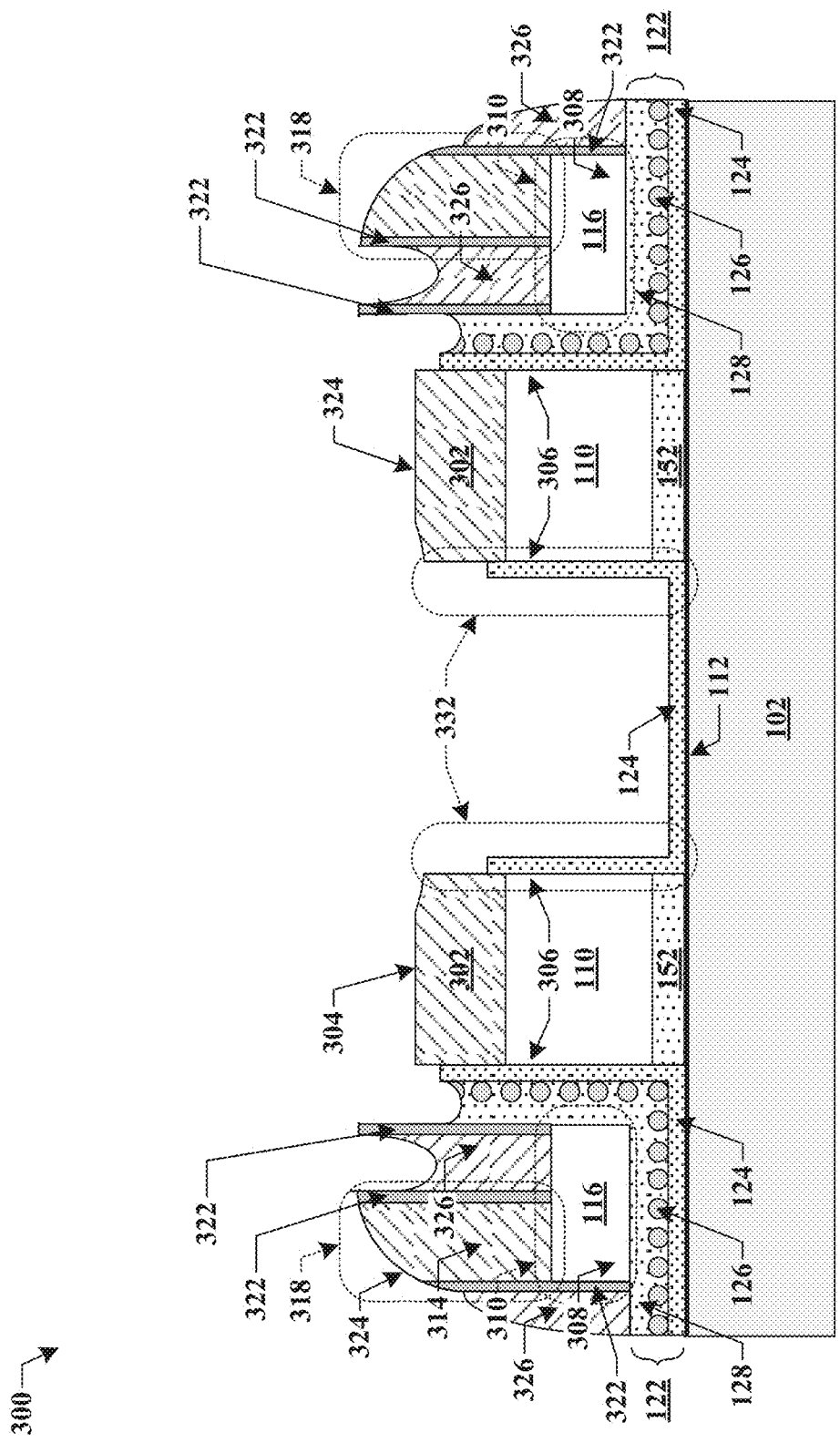
Figure 3N:
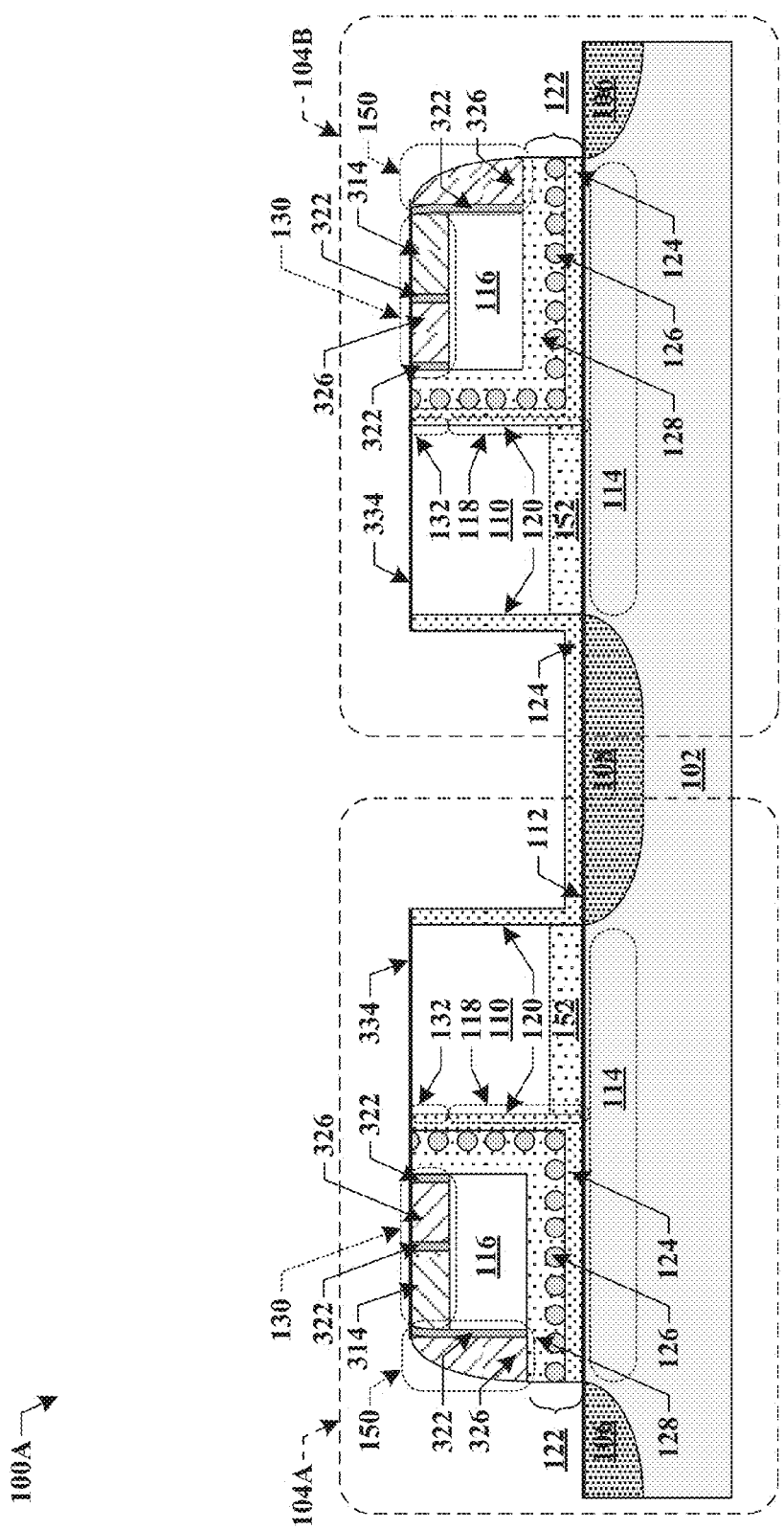

In FIG. 3M, a plasma ashing process has been utilized to remove the photoresist layer 328. A sixth etch has also been performed to remove remaining portions of the control oxide layer 128 and silicon nanocrystals 126 from lower portions of the drain-facing sidewall surfaces 332 of the select gates 110, and from over the surface 112 of the semiconductor substrate 102 between the select gates 110. The sixth etch is configured to leave the tunneling oxide layer 124 along the drain-facing sidewall surfaces 332 (and over the surface 112), such that the select gates 110 are shielded from the sixth etch by the tunneling oxide layer 124. In some embodiments, the sixth etch comprises a wet chemical etch.

In some conventional approaches of memory device formation, the tunneling oxide layer 124 is etched away from the drain-facing sidewall surfaces 332 of the select gates 110, thus exposing the select gates 110 to potential damage by the fifth or sixth etches. However, the presence of the liner oxide layer 322 provides an additional buffer for the fifth and sixth etches, which enlarges the process window for contact formation to a drain region (108) of the memory device 100. Additionally, the main spacer layer 314, the seal layer 326, and the liner oxide layer 322 protect the control gates 116 from potential damage by the fifth or sixth etches.

In FIG. 3N, individual source regions 106 and a shared drain region 108 have been formed, and a channel region 114 has been formed beneath the select gate 110 between the individual source regions 106 and a shared drain region 108. In some embodiments, formation of the source regions 106 and a shared drain region 108 comprises further patterning of the charge-trapping layer 122 over the source regions 106 and a shared drain region 108. Top surfaces 334 of the memory device 100A have then been planarized through a chemical mechanical polish (CMP) or other appropriate process. The pair of control gates 116 of memory cells 104A, 104B are therefore disposed along lower portions 118 of sidewall surfaces 120 of the select gates 110 and over the channel regions 114.

A capping structure 130 is formed from remnants of the liner oxide layer 322, the main spacer layer 314, and the seal layer 326 over the control gate 116 and along an upper portion 132 of the sidewall surface 120 of the select gate 110. Similarly, a composite spacer 150 is also formed from remnants of the liner oxide layer 322 and the seal layer 326 on an opposite side of the control gate 116 from the select gate 110, and protects the drain side of the control gate 116 from damage during contact formation to the shared drain region 108.

Figure 4A:
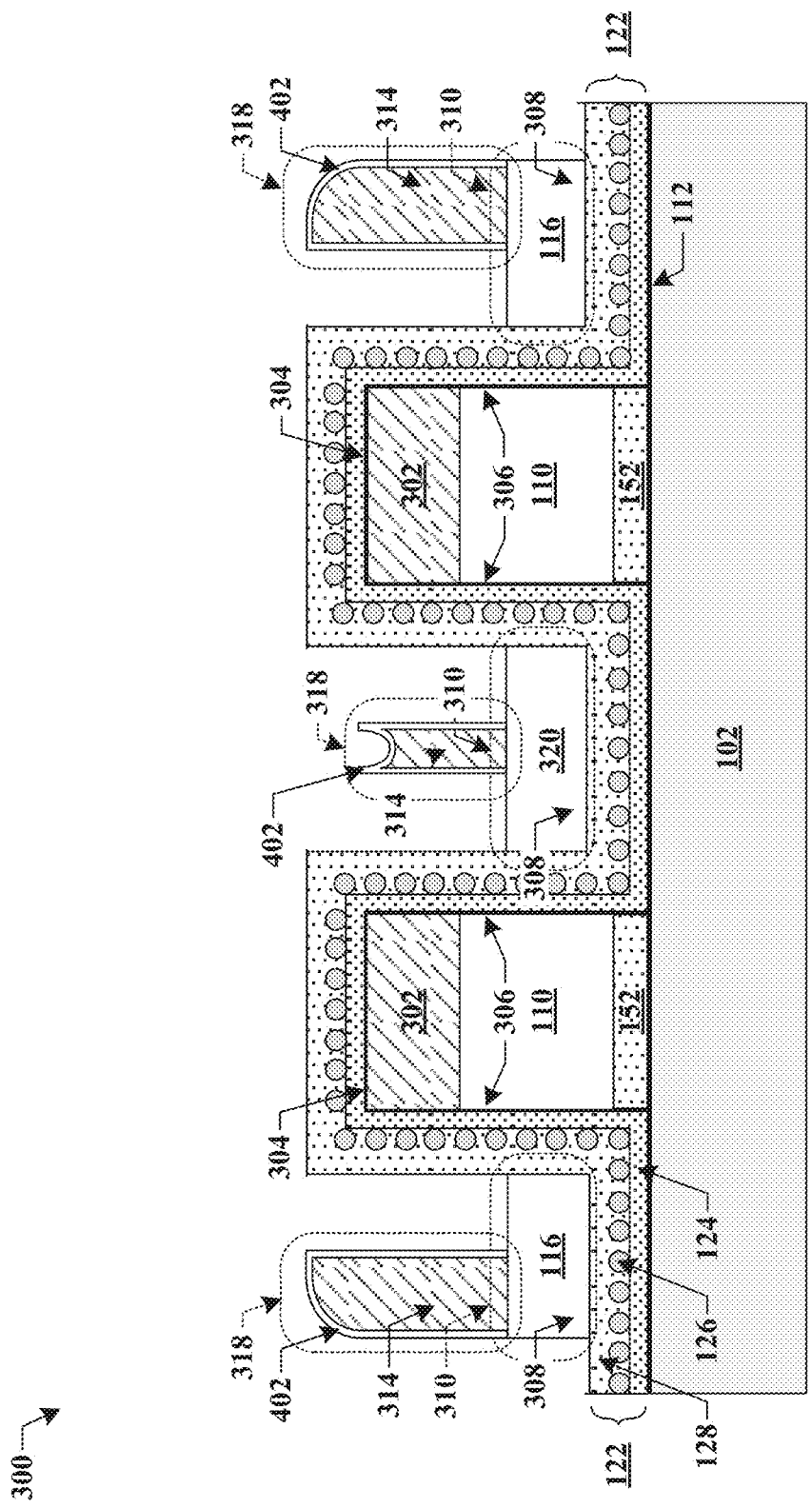
FIGS. 4A-4G illustrate a series of cross-sectional views that collectively depict formation of a memory device in accordance with the present disclosure.

FIGS. 4A-4G illustrate a series of cross-sectional views that collectively depict formation of the memory device 100B. Subsequent to performing the second etch in FIG. 3F, the memory device structure 300 is exposed to oxygen (e.g., the memory device structure 300 is removed from a processing chamber), which results in the formation of a native oxide layer 402 on exposed surfaces of the vertical spacer layer portions 318, as illustrated in FIG. 4A. In some embodiments, the vertical spacer layer portions 318 comprise SiN, and the native oxide layer 402 comprises silicon oxynitride (SiON).

Figure 4B:
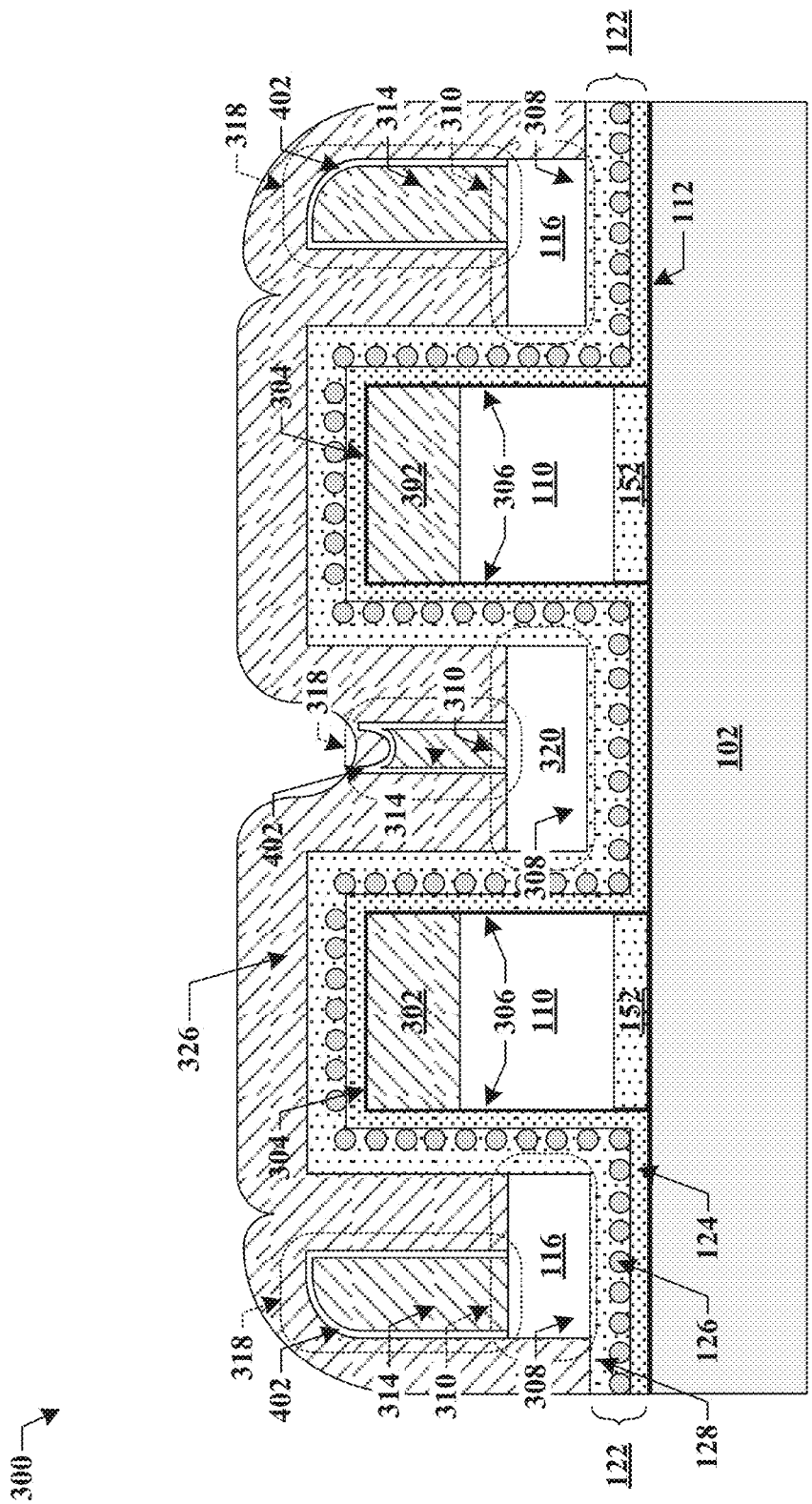

In FIG. 4B, a seal layer 326 (e.g., SiN) is disposed over portions of the charge-trapping layer 122, main spacer layer 314, liner oxide layer 322, and the pair of control gates 116 and the sacrificial control gate 320 exposed by the third etch. As will be appreciated in FIGS. 4C-4G, the seal layer 326 and the native oxide layer 402 combine to form the capping structure 130 of FIG. 1B, which protects a top portion of the pair of control gates 116 during subsequent etch steps. Likewise, as will be appreciated, the seal layer 326 and native oxide layer 402 also combine to form the composite spacer 150 of FIG. 1B, which protects the pair of control gates 116 during etching of the charge-trapping layer 122.

Figure 4C:
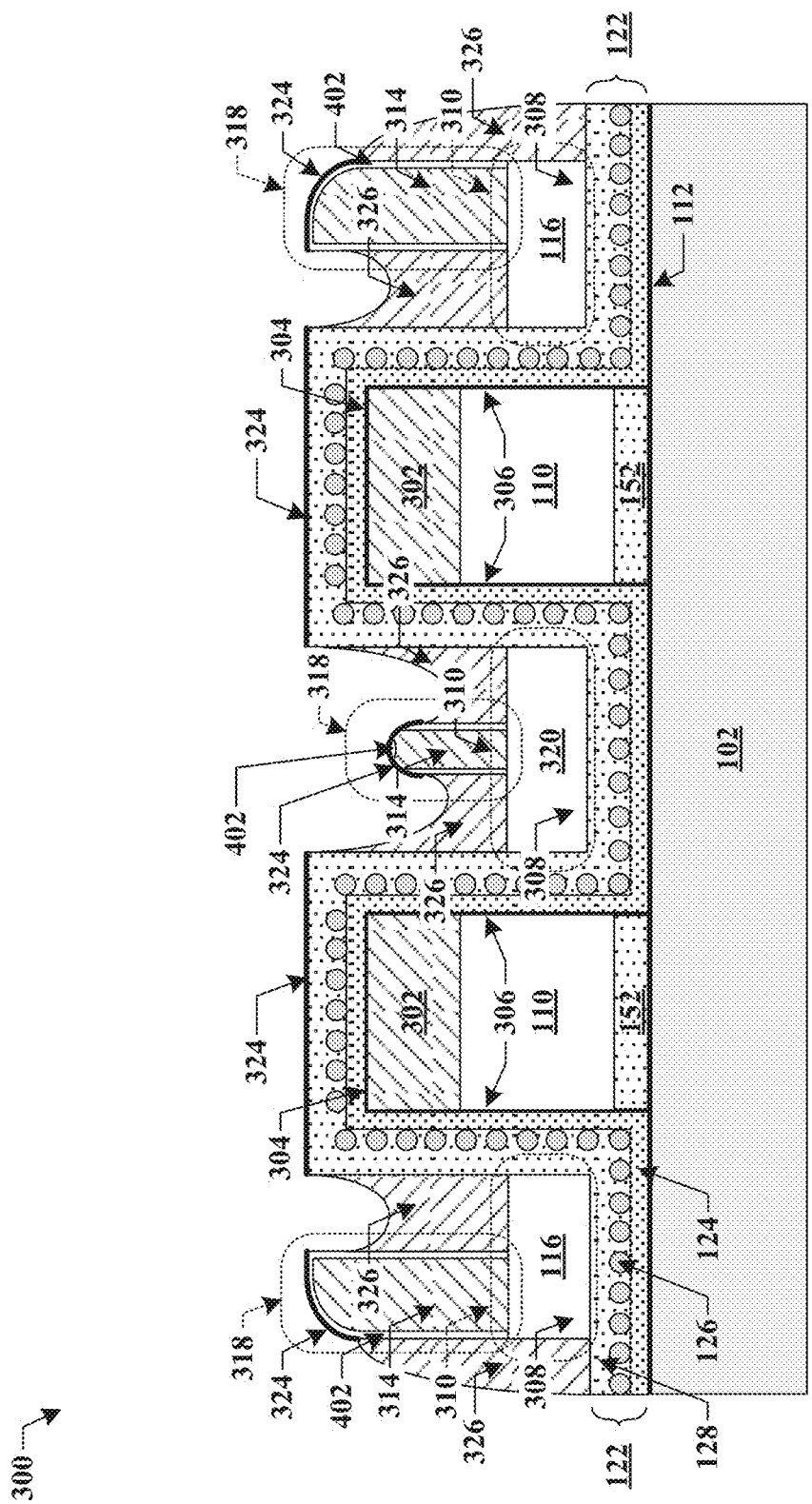

In FIG. 4C, a third etch has been performed on the seal layer 326 to again expose the top surfaces 324 of the main spacer layer 314 and the control oxide layer 128. In some embodiments, the third etch comprises a first isotropic CDE, with a selectivity between the control oxide layer 128 and the seal layer 326 of greater than about 5:1, such that the seal layer 326 is etched greater than about 5× as fast as the control oxide layer 128.

Figure 4D:
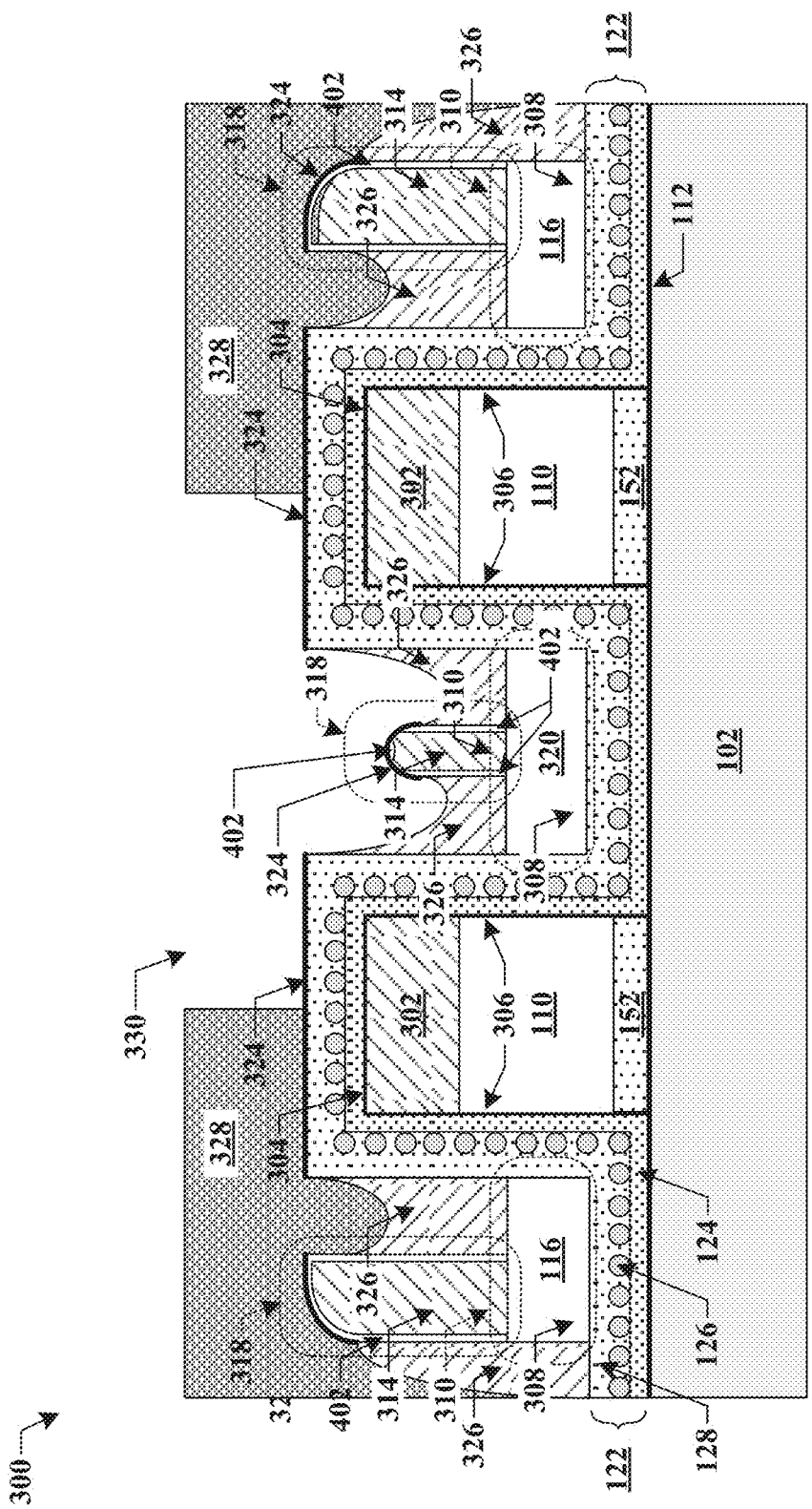

In FIG. 4D, a photoresist layer 328 is disposed, patterned, and exposed to form an opening 330 over the sacrificial control gate 320 (i.e., between the pair of select gates 110).

Figure 4E:
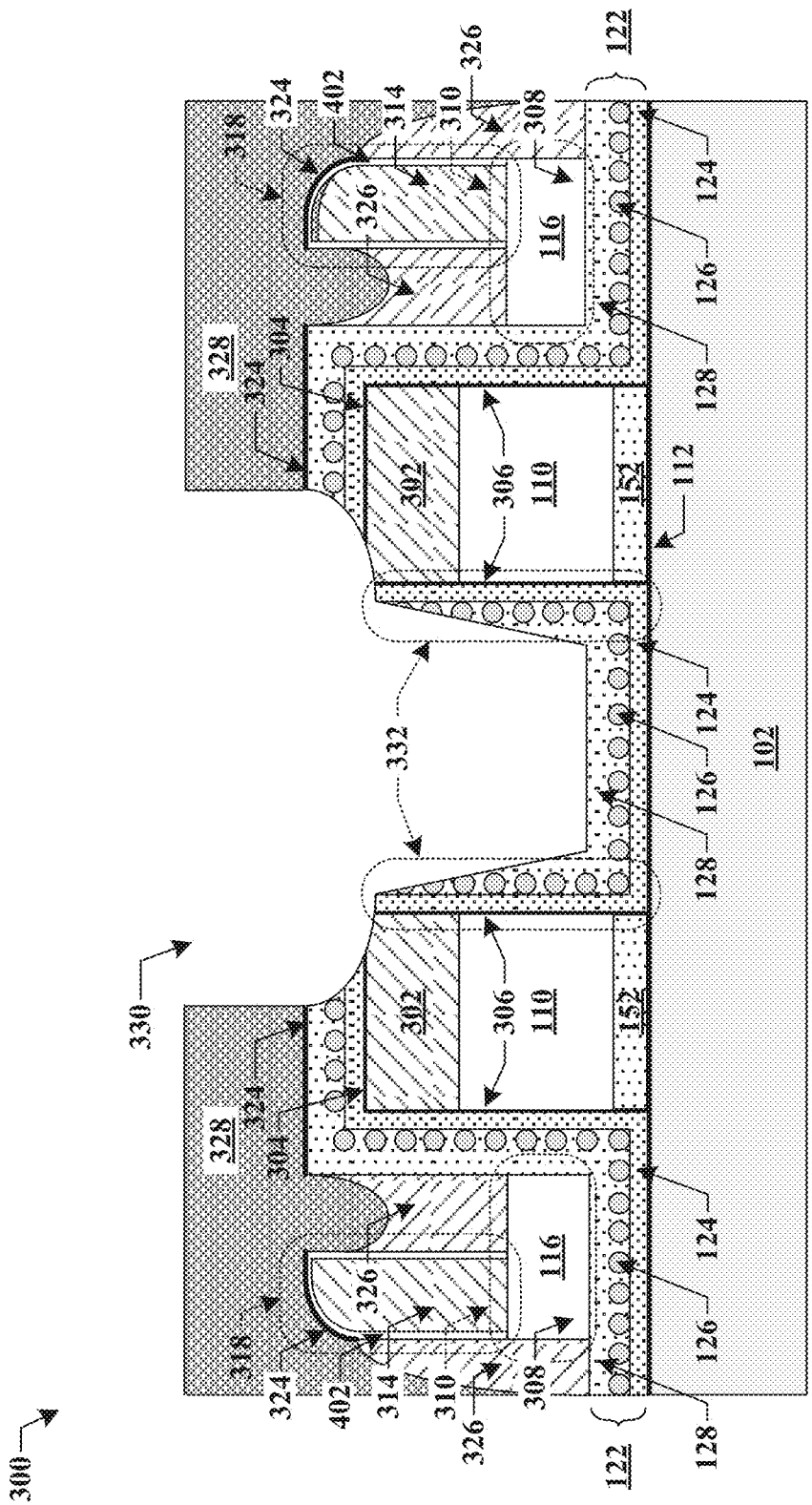

In FIG. 4E, a fourth etch has been performed through the opening 330 the photoresist layer 328, to remove the vertical spacer layer portion 318 of the spacer layer and seal layer 326 formed between the pair of select gates 110, and the sacrificial control gate 320, and to remove a portion of the charge-trapping layer 122 from upper portions of drain-facing sidewall surfaces 332 of the select gates 110.

Figure 4F:
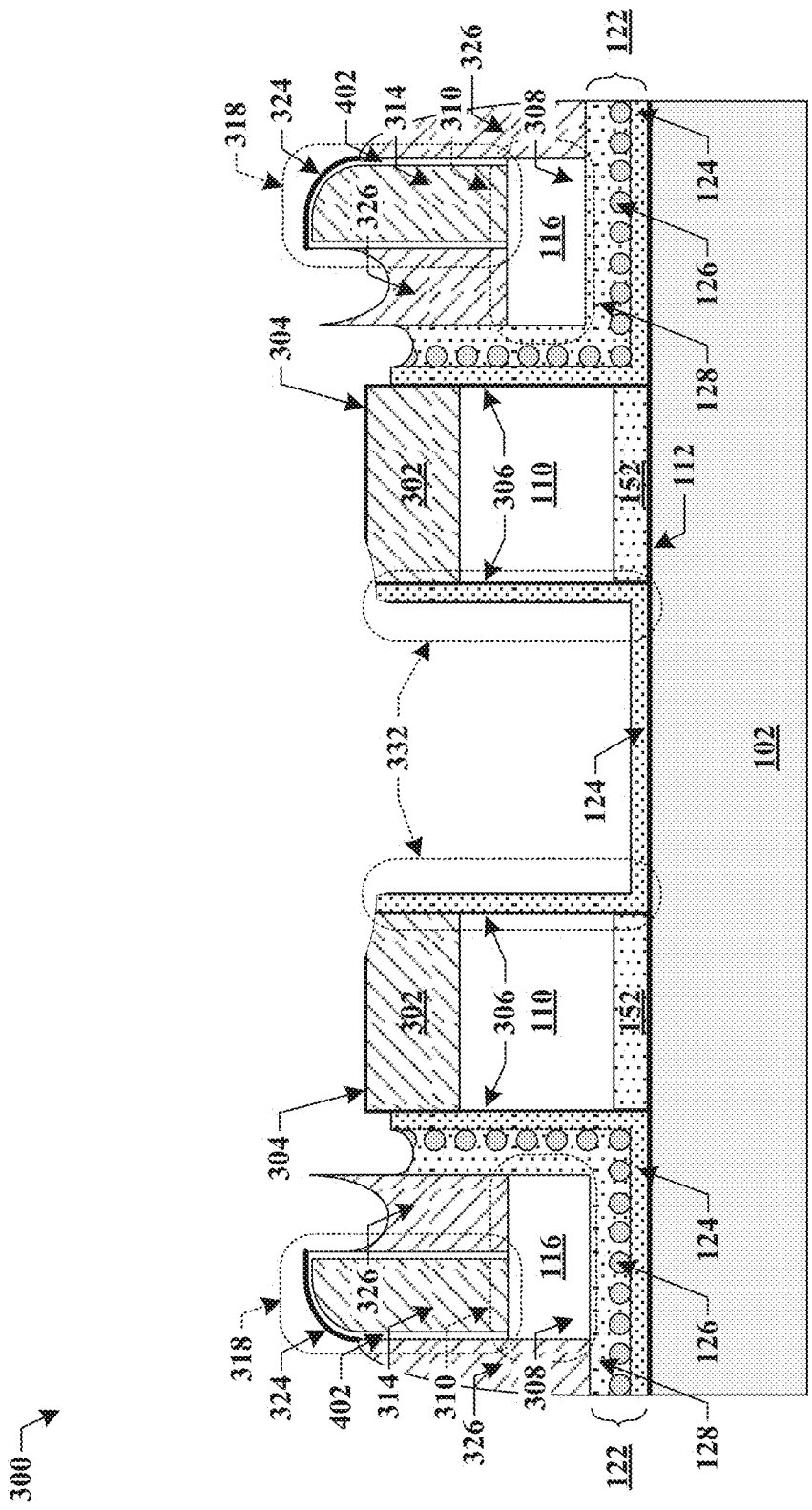

In FIG. 4F a plasma ashing process has been utilized to remove the photoresist layer 328. A fifth etch has also been performed to remove remaining portions of the control oxide layer 128 and silicon nanocrystals 126 from lower portions of the drain-facing sidewall surfaces 332 of the select gates 110, and from over the surface 112 of the semiconductor substrate 102 between the select gates 110.

Figure 4G:
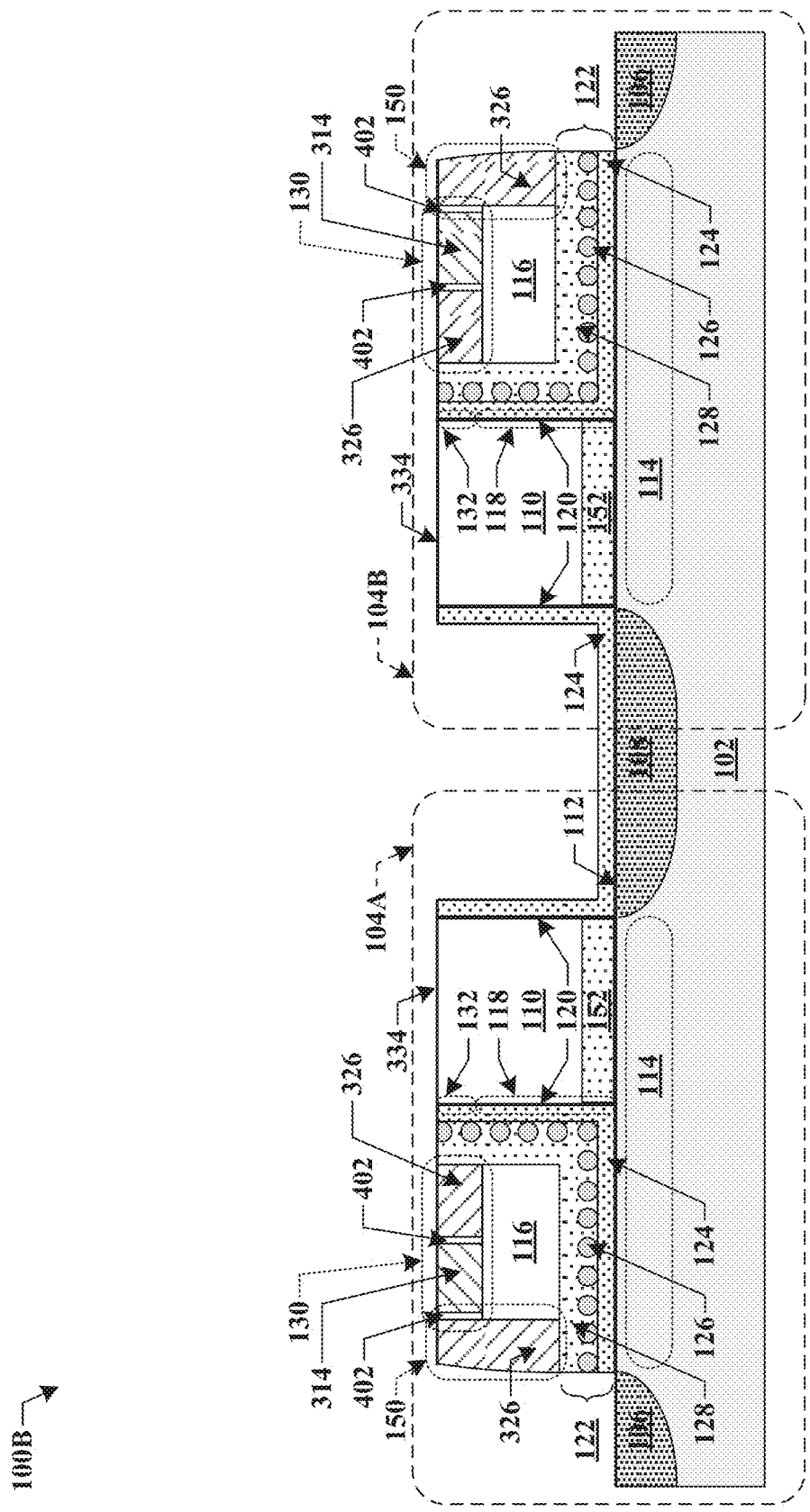

In FIG. 4G, individual source regions 106 and a shared drain region 108 have been formed, and a channel region 114 has been formed beneath the select gate 110 between the individual source regions 106 and a shared drain region 108. Top surfaces 334 of the memory device 100B have then been planarized through a CMP or other appropriate process. The pair of control gates 116 of memory cells 104A, 104B are therefore disposed along lower portions 118 of sidewall surfaces 120 of the select gates 110 and over the channel regions 114.

A capping structure 130 is formed from remnants of the native oxide layer 402, the main spacer layer 314, and the seal layer 326 over the control gate 116 and along an upper portion 132 of the sidewall surface 120 of the select gate 110. Similarly, a composite spacer 150 is also formed from remnants of the native oxide layer 402 and the seal layer 326 on an opposite side of the control gate 116 from the select gate 110, and protects the drain side of the control gate 116 from damage during contact formation to the shared drain region 108.

Operation of the memory device 100A or 100B is now described.

Independent biasing of the select and the control gates 110, 116 allows for writing, reading, and erasing data from the memory device 100A or 100B. In a write mode of operation of the memory device 100A or 100B, a voltage applied to the select gate 110, which allows electrons to move between the source region 106 and the shared drain region 108 through the channel region 114. An independent voltage is then applied to the control gate 116, which promotes tunneling of some the electrons from the channel region 114, through the tunneling oxide layer 124, and into the silicon nanocrystals 126. The electrons are consequently stored within the silicon nanocrystals 126 indefinitely.

The charge resulting from the stored electrons screens an electric field formed between the select gate 110 and the channel region 114 when the select gate 110 is biased. This has an effect of increasing the threshold voltage ($V_t$) of memory cells 104A, 104B by an amount $\Delta V_t$ that is proportional to the thickness of the control oxide layer 128. In a read mode of operation of the memory device 100A or 100B, the threshold voltage increase can be used to sense stored charge within each memory cell 104A, 104B. By applying a voltage ($V_{SG}$) to the select gate 110 that is greater than $V_t$, but less than $V_t+\Delta V_t$, the stored state within each memory cell 104A, 104B can be sensed. If the memory cell 104A, 104B turns on, then it stores a "0" (e.g., no bit). If the memory cell 104A, 104B does not turn on, then it stores a "1" (e.g., one bit).

In an erase mode of operation of the memory device 100A or 100B, a voltage applied to the control gate 116, while no voltage is applied to the select gate 110, which allows the electrons to tunnel from the silicon nanocrystals 126, through the control oxide layer 128, and into the control gate 116. As a result, the charge is removed from the silicon nanocrystals 126 and the memory cells 104A, 104B are erased.

Therefore, some embodiments relate to a memory device comprising a charge-trapping layer disposed between a control gate and a select gate. A capping structure is disposed over an upper surface of the control gate, and a composite spacer is disposed on a source-facing sidewall surface of the control gate. The capping structure and the composite spacer stop or impede any excess etching to prevent damage to the control gate during one more etch processes used for contact formation to the memory device. To further limit or prevent the select gate sidewall etching, some embodiments provide for an additional liner oxide layer disposed along the drain-facing sidewall surface of the select gate. The liner oxide layer is configured as an etch stop layer to prevent etching of the select gate during the one or more etch processes. As a result, the one or more etch processes leave the control gate and select gate substantially intact.

Some embodiments relate to a method to form a memory cell, comprising forming a pair of select gates over a surface of a semiconductor substrate, and forming a charge-trapping layer over top surfaces and sidewall surfaces of the pair of select gates, and over the surface of the semiconductor substrate. The method also comprises forming a sacrificial control gate over the charge-trapping layer between the pair of select gates, and forming a pair of control gates over the charge-trapping layer along outer sidewall surfaces of the select gates. The method further comprises forming a pair of capping structures over the pair of control gates, and forming a composite spacers along outer sidewalls of the pair of control gates. One or more etch processes are then performed to remove the sacrificial control gate and portions of the charge-trapping layer from between the pair of select gates, while using the pair of capping structures and the composite spacers to prevent etching of the control gates by the one or more etch processes.

Other embodiments relate to a memory cell, comprising a select gate disposed over a surface of a semiconductor substrate between source and drain regions that are laterally separated by a channel region arranged beneath the select gate. A control gate is disposed along a lower portion of a sidewall surface of the select gate, and over the channel region between the select gate and the source region. A charge-trapping layer is disposed beneath the control gate and along the sidewall surface of the select gate, which separates the control gate from the select gate. A capping structure is disposed over the control gate and along an upper portion of the sidewall surface of the select gate, the capping structure comprising first and second nitride structures, which are laterally separated from one-another by a first vertically-oriented native oxide layer. A composite spacer comprising a third nitride structure is disposed along an outer sidewall of the control gate.

Still other embodiments relate to a memory cell comprising a select gate disposed over a surface of a semiconductor substrate between source and drain regions that are laterally separated by a channel region arranged beneath the select gate. A control gate is disposed along a lower portion of a sidewall surface of the select gate, and over the channel region between the select gate and the source. A charge-trapping layer is disposed beneath the control gate and along the sidewall surface of the select gate, which separates the control gate from the select gate. A capping structure is disposed over the control gate and along an upper portion of the sidewall surface of the select gate, the capping structure comprising first and second nitride structures, which are laterally separated from one-another by a first vertically-oriented liner oxide layer. A composite spacer comprising a third nitride structure is disposed along an outer sidewall of the control gate.

While method 200 has been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Further, spatially relative terms, such as "over," "on," "beneath," "below," "lower," "above," "upper" and the like, have been used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a select gate disposed over a surface of a semiconductor substrate between a source region and a drain region that are laterally separated by a channel region arranged beneath the select gate;
a control gate disposed along a lower portion of a sidewall surface of the select gate, and over the channel region between the select gate and the source region;
a charge-trapping layer disposed beneath the control gate and along the sidewall surface of the select gate, which separates the control gate from the select gate;
a capping structure disposed over the control gate and along an upper portion of the sidewall surface of the select gate, the capping structure comprising first and second nitride structures which are laterally separated from one-another by a first vertically-oriented liner oxide layer; and
a composite spacer comprising a third nitride structure disposed along an outer sidewall of the control gate.

2. The memory device of claim 1, wherein the capping structure and the composite spacer are laterally separated from one-another by a second vertically-oriented liner oxide layer.

3. The memory device of claim 2,
wherein the first, second, and third nitride structures comprise silicon nitride (SiN); and
wherein the first and second vertically-oriented liner oxide layers comprise silicon oxynitride (SiON).

4. The memory device of claim 2, wherein the first and second vertically-oriented liner oxide layers have a thickness in a range of about 1 nm to about 2 nm, measured in a horizontal direction.

5. The memory device of claim 1, wherein the charge-trapping layer further comprises:
a tunneling oxide layer disposed along the surface of the semiconductor substrate over the channel region, and between the control gate and the select gate along the sidewall surface of the select gate;
a control oxide layer disposed along a surface of the tunnel oxide layer between the tunneling oxide layer and the control gate; and
a plurality of substantially spherically-shaped silicon nanocrystals arranged between the tunneling oxide layer and the control oxide layer along the surface of the tunnel oxide layer.

6. The memory device of claim 5, wherein:
the tunneling oxide layer forms a first continuous shape along the surface of the semiconductor substrate and along the sidewall surface of the select gate; and
the control oxide layer forms a second continuous shape along the tunneling oxide layer.

7. The memory device of claim 5, wherein:
the plurality of silicon nanocrystals abut the surface of the tunneling oxide layer; and
the tunneling oxide layer and the control oxide layer in combination completely embed and surround the plurality of silicon nanocrystals and isolate them from both the select gate and the control gate.

8. A memory device, comprising:
a select gate disposed over a surface of a semiconductor substrate between a source region and a drain region that are laterally separated by a channel region arranged beneath the select gate;
a control gate disposed along a lower portion of a sidewall surface of the select gate, and over the channel region between the select gate and the source;
a charge-trapping layer disposed beneath the control gate and along the sidewall surface of the select gate, which separates the control gate from the select gate;
a first nitride structure disposed over an upper surface of the control gate and laterally separated from the charge-trapping layer by a first vertically-oriented liner oxide layer disposed over the upper surface of the control gate;
a second nitride structure disposed over the control gate and laterally separated from the first nitride structure; and
a second vertically-oriented liner oxide layer laterally separated from the first vertically-oriented liner oxide layer by the first nitride structure and abutting a sidewall of the control gate.

9. The memory device of claim 8 wherein the second nitride structure is laterally separated from the first nitride structure by a third vertically-oriented liner oxide layer.

10. The memory device of claim 9, further comprising:
a third nitride structure disposed along an outer sidewall of the control gate.

11. The memory device of claim 10,
wherein the first, second, and third nitride structures comprise silicon nitride (SiN); and
wherein the first, second, and third vertically-oriented liner oxide layers comprise silicon dioxide ($SiO_2$).

12. The memory device of claim 9, wherein the first, second, and third vertically-oriented liner oxide layers have a thickness in a range of about 1 nm to about 5 nm, measured in a horizontal direction.

13. The memory device of claim 8, wherein the charge-trapping layer further comprises:
a tunneling oxide layer disposed along the surface of the semiconductor substrate over the channel region, and between the control gate and the select gate along the sidewall surface of the select gate;
a control oxide layer disposed along a surface of the tunnel oxide layer between the tunneling oxide layer and the control gate; and
a plurality of substantially spherically-shaped silicon nanocrystals arranged between the tunneling oxide layer and the control oxide layer along the surface of the tunnel oxide layer.

14. The memory device of claim 13, wherein:
the tunneling oxide layer forms a first continuous shape along the surface of the semiconductor substrate and along the sidewall surface of the select gate; and
the control oxide layer forms a second continuous shape along the tunneling oxide layer.

15. The memory device of claim 13, wherein:
the silicon nanocrystals abut the surface of the tunneling oxide layer; and
the tunneling oxide layer and the control oxide layer in combination completely embed and surround the plurality of silicon nanocrystals and isolate them from both the select gate and the control gate.

16. The memory device of claim 8, wherein the first nitride structure and the first vertically-oriented liner oxide layer have upper surfaces that are aligned with an upper surface of the select gate.

17. A memory device, comprising:
a semiconductor substrate comprising a source region and a drain region that are laterally separated by a channel region;
a select gate disposed over the channel region;
a control gate laterally offset from the select gate and vertically arranged over the channel region;
a charge-trapping layer disposed beneath the control gate and between a first sidewall of the control gate and a first sidewall of the select gate;
a first liner oxide layer that has an upper surface that is aligned with an upper surface of the select gate and that overlies an uppermost horizontal surface of the control gate;
a first nitride structure disposed over the control gate and laterally separated from the select gate by the first liner oxide layer;
a second nitride structure disposed over the control gate and laterally separated from the first nitride structure by a second liner oxide layer; and
a first segment of tunnel oxide arranged along a second sidewall of the select gate opposite the first sidewall and having an upper surface aligned with an upper surface of the select gate.

18. The memory device of claim 17, further comprising:
a third nitride structure having a flat sidewall abutting the first liner oxide layer and a curve sidewall opposite the flat sidewall.

19. The memory device of claim 17, further comprising:
an inter-level dielectric layer separating the first segment of tunnel oxide from a conductive contact, which vertically extends through the inter-level dielectric layer to electrically contact the drain region.

* * * * *